US008257781B1

(12) United States Patent
Webb et al.

(10) Patent No.: US 8,257,781 B1
(45) Date of Patent: Sep. 4, 2012

(54) ELECTROLESS PLATING-LIQUID SYSTEM

(75) Inventors: Eric G. Webb, West Linn, OR (US); Steven T. Mayer, Lake Oswego, OR (US); David Mark Dinneen, Portland, OR (US); Edmund B. Minshall, Sherwood, OR (US); Christopher M. Bartlett, Beaverton, OR (US); R. Marshall Stowell, Wilsonville, OR (US); Mark T. Winslow, Camas, WA (US); Avishai Kepten, Lake Oswego, OR (US); Jingbin Feng, Lake Oswego, OR (US); Norman D. Kaplan, Portland, OR (US); Richard K. Lyons, Sandy, OR (US); John B. Alexy, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 1107 days.

(21) Appl. No.: 11/201,709

(22) Filed: Aug. 11, 2005

Related U.S. Application Data

(63) Continuation-in-part of application No. 10/609,518, filed on Jun. 30, 2003, now abandoned, and a continuation-in-part of application No. 11/200,338, filed on Aug. 9, 2005, now Pat. No. 7,690,324.

(60) Provisional application No. 60/392,203, filed on Jun. 28, 2002.

(51) Int. Cl.
*C23C 14/00* (2006.01)
(52) U.S. Cl. ..................................... 427/97.9; 427/99.5
(58) Field of Classification Search ................. 427/97.9, 427/99.5, 304, 437, 443.1, 107, FOR. 107, 427/98; 118/602, 603; 429/462, 515
See application file for complete search history.

(56) References Cited

U.S. PATENT DOCUMENTS

| | | | | |
|---|---|---|---|---|
| 4,059,451 A | * | 11/1977 | Oita et al. | 106/1.26 |
| 4,544,446 A | * | 10/1985 | Cady | 438/689 |
| 4,550,036 A | * | 10/1985 | Ludwig et al. | 427/443.1 |
| 4,699,081 A | * | 10/1987 | Mack | 118/691 |
| 5,112,392 A | * | 5/1992 | Anderson et al. | 106/1.22 |
| 5,232,511 A | * | 8/1993 | Bergman | 134/2 |
| 5,419,821 A | * | 5/1995 | Vaughan | 204/522 |
| 5,462,207 A | * | 10/1995 | Daraktchiev | 222/148 |
| 5,472,585 A | * | 12/1995 | Dinella et al. | 427/99.5 |
| 5,691,003 A | * | 11/1997 | Sone et al. | 427/437 |
| 5,741,362 A | * | 4/1998 | Kobayashi | 118/603 |

(Continued)

FOREIGN PATENT DOCUMENTS

GB 2257715 * 8/2000

*Primary Examiner* — Michael Cleveland
*Assistant Examiner* — Tabassom Tadayyon Eslami
(74) *Attorney, Agent, or Firm* — Weaver Austin Villeneuve & Sampson LLP

(57) ABSTRACT

A main reservoir holds cool reactant liquid. A reaction vessel for treating a substrate is connected to the main reservoir by a feed conduit. A heater is configured to heat reactant liquid in the feed conduit before the liquid enters the reaction vessel. Preferably, the heater is a microwave heater. A recycle conduit connects the reaction vessel with the main reservoir. Preferably, a recycle cooler cools reactant liquid in the recycle conduit before the liquid returns to the main reservoir. Preferably, an accumulation vessel is integrated in the feed conduit for accumulating, heating, conditioning and monitoring reactant liquid before it enters the reaction vessel. Preferably, a recycle accumulator vessel is integrated in the recycle conduit to accommodate reactant liquid as it empties out of the reaction vessel.

77 Claims, 10 Drawing Sheets

U.S. PATENT DOCUMENTS

| | | | |
|---|---|---|---|
| 6,041,799 A * | 3/2000 | Aoki ............................. 134/184 |
| 6,065,424 A * | 5/2000 | Shacham-Diamond et al. ............................. 118/696 |
| 6,093,453 A | 7/2000 | Ang |
| 6,158,445 A * | 12/2000 | Olesen et al. ................. 134/1.3 |
| 6,165,912 A | 12/2000 | McConnell et al. |
| 6,431,190 B1 | 8/2002 | Oka et al. |
| 6,537,416 B1 | 3/2003 | Mayer et al. |
| 6,588,437 B1 * | 7/2003 | Higashi ........................ 134/148 |
| 6,616,772 B2 | 9/2003 | de Larios et al. |
| 6,713,122 B1 | 3/2004 | Mayer et al. |
| 7,690,324 B1 | 4/2010 | Feng et al. |
| 2003/0141018 A1 | 7/2003 | Stevens et al. |
| 2004/0065540 A1 | 4/2004 | Mayer et al. |
| 2004/0198190 A1 * | 10/2004 | Basol et al. ..................... 451/41 |
| 2005/0022418 A1 * | 2/2005 | Rietmann ....................... 34/493 |
| 2005/0176990 A1 * | 8/2005 | Coleman et al. ................ 562/11 |
| 2006/0063382 A1 | 3/2006 | Dubin et al. |

\* cited by examiner

ELECTROLESS PLATING-LIQUID SYSTEM

RELATED APPLICATIONS

This application is a continuation-in-part application, claiming priority under 35 USC 120, of co-owned U.S. patent application Ser. No. 10/609,518, Now Abandoned filed Jun. 30, 2003, by Mayer et al., having the title "Liquid Treatment Using Thin Liquid Layer", which claimed the benefit of U.S. Provisional Application Ser. No. 60/392,203, filed Jun. 28, 2002. This application is also a continuation-in-part application of a co-owned U.S. patent application Ser. No. 11/200, 338, filed Aug. 9, 2005, by Feng et al. Now U.S. Pat. No. 7,690,324 having the title "Small-Volume Electroless Plating Cell". These patent documents are incorporated herein by reference for all purposes.

FIELD OF THE INVENTION

The invention is related to the field of integrated circuit fabrication, in particular to methods and systems for managing and maintaining liquids used for liquid chemical reactions.

BACKGROUND OF THE INVENTION

Electroless plating (or electroless deposition) of copper and other metals has received increasing interest in recent years. This interest is due in part because of the relatively low cost of electroless processes compared to other (e.g., vacuum) deposition techniques, and because of generally surface-controlled, selective, conformal deposition properties of electroless processes. Electroless deposition has a number of potential applications, such as repair of marginal seed layers for copper damascene electroplating, creation of seed layers and barrier layers directly on dielectrics that can be plated, and selective deposition of barrier and electromigration capping layers onto damascene metal (e.g., cobalt and cobalt alloys on copper).

Conventional electroless metal deposition is conducted in a system containing one or multiple open baths containing plating solution. In a typical operation, a wafer holder immerses a substrate wafer face-down in the plating solution during plating operations. The plating solution is exposed to ambient air, especially when the substrate wafer is being moved and the wafer holder does not cover the plating bath surface. Thus, an open bath system has disadvantages. For example, during the metal deposition step, ambient oxygen is readily dissolved in the solution, and the dissolved oxygen can interfere with the desired metal deposition (e.g., by slowing or preventing metal deposition). Electroless plating operations are typically performed at elevated temperatures in a range of 40° C. to 90° C., typically in a range of about 50° C. to 80° C. The plating solution components have a tendency to evaporate. The tendency of water and volatile components to evaporate is exacerbated by the need to ventilate the gaseous spaces over a plating bath, especially to remove explosive or toxic fumes inherent to the electroless solution (e.g., ammonia gas) or created by spontaneous decomposition of its components (e.g., dimethylamine, hydrogen). The heating load caused by evaporation substantially increases the size and costs of a heater required to maintain plating bath temperature. Condensation of evaporate bath constituents on plating-cell walls and on the wafer holder are a source of backside contamination.

A conventional electroless plating bath typically can have a bath volume of 20 liters or more. Typical bath turnover rates required to avoid plate-out and composition drift are 6 hours to 10 hours. Assuming a processing rate of 20 wafers per hour, approximately 160 wafers can be processed with 20 liters.

A problem of both face-down and face-up plating configurations is hydrogen-bubble entrapment on the plating surface and resulting defects. Hydrogen gas is created as a byproduct of almost all known electroless plating-solution reducing agents. A byproduct of most electroless plating oxidation half-reactions (i.e., the oxidation of the reducing agent) and of the self-degradation of the reducing agents is dissolved molecular hydrogen ($H_2$). As these reactions continue (i.e., plating reactions and bath-aging), the amount of hydrogen increases until the solution becomes saturated and eventually supersaturated with dissolved hydrogen. When this occurs, the formation of hydrogen gas (bubbles) is spontaneous, and occurs most readily on solid interfaces (e.g., vessel walls, wafer surfaces). Areas in which bubbles are attached to the wafer are not plated, creating defects. Therefore, it is advantageous to utilize designs that minimize the propensity for hydrogen formation, or minimize the effective bath age.

Solution pH influences the reaction rate of the electroless plating process. It is often useful to utilize an alkaline pH-adjuster, for example, lithium-, sodium-, or potassium-hydroxide, but preferably ammonium- or tetramethylammonium hydroxide ("TMAH") to maintain or adjust the pH. Alkali metal pH-adjusters are inexpensive, but are often unsuitable for semiconductor applications because of their rapid diffusion into and poisoning of various device materials. Ammonium hydroxide is also inexpensive and does not generally degrade device performance, but it is volatile. Therefore, the maintenance of ammonium hydroxide concentration in a plating bath is problematic. TMAH and other analogous organic cation hydroxides do not suffer from either of these problems, but are significantly more expensive. The constituents of a semiconductor electroless plating solution, particularly the reducing agents and TMAH, can be expensive, leading to bath costs in a range of $25/liter to $100/liter. Therefore, one would like to use lower cost materials without the negative impacts. Also, the waste treatment of electroless plating solutions is complicated and expensive. A waste treatment process generally involves forced decomposition of the reducing agents, accompanied by hydrogen gas stripping and dilution. A small amount of dissolved reducing agent can spontaneously breakdown to create a large volume of hydrogen gas in a storage container (an explosive hazard), so the stripping of reducing agents must be driven to completion. A plating solution must also be stripped of metal. The cost of such plating solution post-processing (including capital equipment costs) is typically in a range of $5/liter to $10/liter. Inefficient use of the plating solution, therefore, increases the cost of plating operations significantly.

Electroless plating solutions are also often inherently unstable. The instability manifests itself in auto-degradation of bath constituents and in the "plating-out" of bath metal as fine metallic particulate in the bulk solution and onto processing equipment walls, filters, and other system components. The presence of plate-out particles also increases the number of defects in the workpieces and diminishes process yield. Generally, the instability of plating solutions increases with reducing agent concentration and with temperature, and decreases with the addition of bath "stabilizers" (e.g., oxygen, chlorine, lead, tin, cadmium, selenium, tellurium). In opposition to this trend, the initiation of electroless plating of a particular metal onto a substrate and the plating deposition rate are also proportional to reducing agent concentration and temperature, and decrease with the addition of bath stabilizers. Thus, plating-solution instability and electroless plating rate and nucleation are inherently linked in a non-advantageous manner. While filtration can remove particles from a plating bath, the usefulness of such filtration when the plating bath is maintained at plating operating temperature is, at best, marginal. Filtration at elevated temperature only temporarily combats the effects of auto-degradation/particulation as particles remain in contact with the plating bath reactants, consume reactants, and grow. Some complex proposals for continuously removing electroless plating particles have been proposed in the prior art (e.g., a magnetic conveyer belt "filter").

An electroless plating tool's fluid system is typically maintained at an elevated temperature to increase the propensity for reaction (deposition). However, several factors typically complicate the implementation of such electroless deposition systems. A generally accepted rule for chemical reactions at near-ambient conditions is that the chemical reaction rate doubles for each 10° C. increase in temperature (based on typical activation energies for chemical reaction rates). Due to this exponential thermal dependence, any heating system that locally over-drives the plating solution is more likely to cause adverse localized chemical reactions.

To be useful for semiconductor applications, the working electroless plating bath and wafer must be of uniform condition. As applied to thermodynamics, and to prevent wafer-to-wafer variation, the plating tool must reach a condition of equilibrium including all heated components. In a conventional system, the mass of heated components may be quite large, thereby requiring substantial time to stabilize. A large-volume bath will also require increased time to heat from ambient to process temperature (it is generally preferred to first mix/create these baths in the cold-state, hence the assumption of ambient starting condition).

For those process chemistries which are most unstable, point of use mixing has been used in the prior art to minimize the thermal exposure of the bath. In such point-of-use mixing, reactive constituents are combined in-line with the balance of the treatment solution immediately prior to use. However, such in-line mixing suffers from mixture-ratio transients, and the resultant fluid cannot readily be reclaimed and reused.

In traditional fluid heating schemes, thermal energy is typically added to the fluid by use of either radiation (e.g. infrared) or conduction (e.g. heating element). With an IR heating system, the fluid must be contained within an object that allows the infrared energy to penetrate through the wall to the fluid itself. However, materials suitable for semiconductor processing fluids are not entirely transparent to IR energy, thereby causing the containment wall to heat up above the bulk fluid temperature. Similarly, conductive heating systems are necessarily affected by over-temperatures, since it is the difference in temperature ($\delta T$) that drives the desired heat transfer. Conductive heating requires that the heating element be operated at a temperature above the desired bulk-fluid temperature. The higher the thermal gradient, the faster the fluid can be raised to the desired temperature. As applied to the heating of electroless plating chemistries, these plating baths become increasingly reactive/unstable at higher temperatures. To ensure a uniform film on a semiconductor wafer, it is imperative that precise and uniform temperature be maintained. Hence, several shortcoming of conductive heating are evident. The need to maintain the heating element above the desired fluid temperature causes excessive bath degradation. The fluid heating rate is proportional to the heating element temperature. Therefore, in order to hasten the heating rate of the bulk-fluid, it becomes necessary to increase the heater temperature, thereby causing a small portion (proximal to the heating element) of the fluid to be over-heated (before convection equilibrates the bulk-fluid temperature). To attain fast and precise temperature control, event timing becomes critical. Therefore, if the heated fluid is not removed from the heating vessel in a timely and consistent manner, the wafer-wafer thermal environment varies (resulting in a variation in film thickness).

FIG. 1 depicts schematically a generalized conventional system 100 of the prior art for conducting electroless plating. In a system 100, a plating cell 102 contains plating bath 104 comprising electroless plating solution. A substrate wafer 106 in a substrate holder 108 is immersed face-down in plating bath 104 during metal deposition. Plating solution is recirculated from plating cell 102 to an overflow reservoir 110 containing recirculated solution 112. Recirculated solution then flows via pump 114 through a heater 116 and a filter 118, to be returned to plating cell 102. Typically, reservoir 110 is substantially closed to the atmosphere. Generally, a portion or all of the plating solution is drawn off through drain 120 for disposal, and a corresponding amount of fresh plating solution from liquid source 122 replenishes liquid in system 100. System 100 suffers from several disadvantages. The entire liquid volume included in plating cell 102 and reservoir 110 must be maintained substantially at the intended wafer-treatment temperature, resulting in significant chemical degradation and high cost of operation. Filtration and metrology must be accomplished at elevated temperatures, resulting in reduced lifetime and greater sensor variability. Also, when wafer 102 and substrate holder 108 are not in a lowered plating position as depicted in FIG. 1, a relatively large surface area of plating solution in plating cell 104 is exposed to the atmosphere. As described above, such exposure leads to constituent evaporation and plating-solution degradation. Furthermore, fluid filter 118 shares the same circulation loop as plating cell 102. Therefore, it is impossible to decouple the plating-cell flow rate from the filter flow rate. In the case of electroless cobalt plating, it has been found that quiescent fluid environments are required for particle-free plating. However, since auto-generation of metal particles is practically inevitable in this type of plating environment, flow rates to achieve a quiescent environment result in limited filtration. Limited filtration, therefore, likely leads to an increase in particle load, which further degrades plating solution.

Spray techniques have been suggested for electroless plating. See, for example, U.S. Pat. No. 6,065,424, issued May 23, 2000 to Shacham-Diamand et al. In such techniques, reacting plating solution is applied to a wafer surface as a spray or mist. Typically, the wafer is rotating under the spray or mist, and liquid solution is spun radially outwards. Under such conditions, it is difficult to maintain a sufficiently high and uniform reaction temperature because of the simultaneous cooling of the hot fluid by evaporation of the solvent (e.g., water). Alternatively, heating the backside of the wafer by a heated chuck is possible. Nevertheless, this requires a relatively massive element with sufficient heat capacity to maintain a globally uniform temperature over a standard 200 millimeter (mm) or 300 mm wafer. Also, the face-up base of the heating element/chuck is susceptible to chemical contamination and transfer of that contamination to the wafer backside. Furthermore, backside heating does not solve the problem of non-uniform evaporation and cooling of the bath solvent. On the other hand, a wafer chuck should be capable of spinning at high revolutions per minute (rpm) to enable spin-drying. Splashing of liquid against apparatus walls and misting back onto the product surface can cause contamination of the apparatus and defects on the workpiece. Evaporation and misting of plating solution into the plating space results in substantial loss of the plating solution, and unwanted formation of volatile hazardous chemicals in the effluent.

Maintaining bath concentration, therefore, requires complicated and expensive monitoring and control techniques. U.S. Pat. No. 6,713,122, issued Mar. 30, 2004, to Mayer et al., which is hereby incorporated by reference, solves some aspects of these problems related to process thermal management by decreasing air exposure and by including a recirculation system that decreases the heating load of electroless plating fluid. United States Patent Application Publication No. 2003/0141018, by Stevens et al., published Jul. 31, 2003, teaches an electroless deposition apparatus in which a substrate support holds a substrate wafer in a face-up orientation and an evaporation shield is positioned over the substrate to form a gap that is filled with liquid plating solution.

Wet processing of isolated conductive-metal circuits connected to transistor elements in the presence of light often encounters a number of processing challenges. One problem is the creation of a photo-induced power source when p-n junctions in the base-circuit transistors are exposed to light. Another problem is the completion of a corrosion circuit on the surface being processed between the exposed isolated metal lines and a processing electrolytic solution. The energy of the light photons is converted to electrical energy, creating a reverse bias potential and a corrosion circuit.

Thus, liquid chemical reaction techniques, for example, electroless plating techniques, typically encounter problems such as: difficult or unsuitable control of reaction and process conditions; inability to vary rapidly or dynamically various operating conditions; inability to handle unstable reaction mixtures; accumulation of reaction byproducts; inefficient use of expensive liquid solutions; frequent wafer-handling between process steps; high capital cost of equipment for multi-step processes; and excessive use of valuable cleanroom floor space.

SUMMARY OF THE INVENTION

The invention helps to solve some of the problems mentioned above by providing systems and methods for managing, processing and maintaining reactant liquids used for treatment of integrated circuit substrates.

A basic embodiment of a system in accordance with the invention for conducting liquid reaction treatment of an integrated circuit substrate comprises a reaction vessel for treating a substrate and a main reservoir for holding cooled reactant liquid. The main reservoir has a recycle inlet and a reservoir outlet. A feed conduit fluidically connects the reservoir outlet with the reaction vessel. A basic embodiment further includes a heater for heating reactant liquid in the feed conduit. A recycle conduit fluidically connects the reaction vessel with the recycle inlet of the main reservoir. A basic embodiment further includes a recycle cooler for cooling reactant liquid in the recycle conduit. Some embodiments include a cooler for maintaining the temperature in the main reservoir at a cool level; for example, at a temperature in a range of about from 5° C. to 25° C. Maintaining a cool temperature of reactant liquid decreases the kinetic reaction rates of undesired reactions in the reactant liquid. In preferred embodiments, the main reservoir is operable to be substantially closed to the atmosphere. A closed reservoir limits exposure of reactive liquid to oxidizing gases, inhibits undesired evaporation of reactant liquid, and inhibits uncontrolled escape of vapors from the main reservoir. A preferred embodiment further comprises a means for purging gas, especially air and other oxygen-containing gases, from a substantially closed main reservoir. Some embodiments include a vacuum pump for removing gases from the main reservoir and for creating a partial vacuum in the reservoir. In some embodiments, a main reservoir is designed to inhibit liquid located in the reservoir from contacting a gas phase. Some embodiments include an inert gas source for flowing inert purging gas through a gaseous space above reactant liquid in the main reservoir.

Preferably, the heater comprises a microwave heater. Some embodiments further include a filter for filtering reactant liquid in the feed conduit. Some embodiments further include a filter for filtering reactant liquid in the recycle conduit. Some embodiments further include a particle counter for counting particles in the feed conduit.

Some embodiments include an accumulation vessel integral with the feed conduit. Preferably, the accumulation vessel is operable to be substantially closed to the atmosphere. Some embodiments include a means for pressurizing the accumulation vessel. Some embodiments include an inert gas source for flowing gas into a gaseous space in the accumulation vessel. The inert gas is useful for pressurizing the accumulation vessel and for purging a gaseous space in the accumulation vessel. In some embodiments, the heater is configured to heat reactant liquid in the accumulation vessel. Heating reactant liquid in the accumulation vessel serves to pre-heat reactant liquid shortly before it flows into the reaction vessel and also functions to drive dissolved gases out of the reactant liquid. Some embodiments include a still chamber in an accumulation vessel for quieting reactant liquid before it flows to the reaction vessel. Some embodiments include a filter in the accumulation vessel for removing gas bubbles from reactant liquid. Some embodiments include a means, such as a vacuum pump, for removing undesired gas from an accumulation vessel and for creating a partial vacuum in the accumulation vessel, which helps to drive dissolved gases out of solution. In some embodiments, an accumulation vessel is designed to inhibit liquid located in the accumulation vessel from contacting a gas phase.

Some embodiments include a cooling loop located in the recycle conduit for recirculating reactant liquid through the recycle cooler before returning the liquid to the main reservoir. Preferred embodiments include a recycle accumulator vessel located in the recycle conduit that accommodates the volume of reactant liquid that empties out of the reaction vessel. Preferably, a recycle accumulator vessel is designed to inhibit liquid located in the accumulator vessel from contacting a gas phase. Some embodiments include a means, such as a vacuum pump, for removing gas from a substantially closed recycle accumulator vessel and for creating a partial vacuum in the accumulator vessel.

Typically, a system further includes a drain conduit fluidically connected with the reaction vessel. Some embodiments include a reaction-vessel manifold fluidically connecting the reaction vessel with the feed conduit, the recycle conduit, and the drain conduit.

Preferably, the reaction vessel comprises a reaction space having a small reaction volume.

Some embodiments include a plurality of reaction vessels, each reaction vessel being fluidically connected to the main reservoir through a feed conduit and a recycle conduit. Some embodiments include a plurality of main reservoirs.

A basic embodiment of a method in accordance with the invention of conducting liquid reaction treatment of an integrated circuit substrate includes processes of: flowing cooled reactant liquid from a main reservoir through a feed conduit to a reaction vessel; heating the reactant liquid in the feed conduit; forming a liquid treatment-volume of reactant liquid in the reaction vessel; immersing a treatment surface of the substrate in the liquid-treatment volume of reactant liquid to treat the surface; flowing a recycle portion of the liquid treatment-volume from the reaction vessel through a recycle conduit to the main reservoir; and cooling the recycle portion in the recycle conduit before returning the liquid to the main reservoir.

Typically, a method further includes processes of flowing a drain portion of the liquid treatment-volume from the reaction vessel through a drain conduit. Generally, the reactant liquid is heated in a portion of the feed conduit, preferably in an accumulation vessel. Preferably, heating is conducted using a microwave heater or other heating means that does not require a temperature differential to effect heating, so that no liquid temperature exceeds a desired bulk set-point temperature.

A novel liquid-handling system including a liquid treatment cell enables processing of integrated circuit wafers with high throughput and low cost of ownership. Embodiments of such an apparatus are useful for, among others: selective electroless deposition of cobalt and nickel (including combinations of Co, Ni, B, P, and W using electroless process solutions); electroless plating (e.g., deposition of seed layers or the modification of vacuum-deposited seed layers by electroless copper deposition); metal etching (e.g., etching of copper, Ta, TiSN, Co, Ni, etc.); electroless (chemical) polishing (e.g., of copper); various surface treatments (e.g., copper surface reaction with benzotriazole or 3-mercapto-1-propane sulfonic acid); and cleaning and rinsing operations. In particular embodiments in accordance with the invention, a cobalt alloy is electrolessly plated onto copper material in an integrated circuit substrate. An example is a cobalt-capping layer for capping copper.

The invention is described primarily with respect to its application to electroless plating, but the invention also includes embodiments useful for other treatments of a substrate wafer surface using a small volume of liquid enclosed in a treatment space, particularly liquid chemical-reaction processes and related pretreatment and post-treatment operations. For example, removal of metal layers is also conducted in accordance with the current invention.

Embodiments in accordance with the invention enable efficient use of often unstable fluid reactants and other processing chemicals at elevated temperatures, combined with recycling and cooling of these chemicals to reduce operating costs further.

A microwave heater is incorporated into the electroless plating solution bath management system to control the thermal profile of the plating solution during heating. Two distinct advantages of microwave heating are the elimination of a thermal differential for the purpose of heating, as well as a more rapid heating profile (given a small over-temperature constraint). These characteristics become critical in some embodiments in accordance with the invention due to the inherent instability of some reactant liquids. Chemical reactant liquids in accordance with the invention, such as electroless plating solutions and chemical etching solutions, generally require no external driving force (e.g., plasma used in a PECVD reaction, or DC current used in electrolytic applications). On the other hand, they must be maintained such that they readily react as desired at a semiconductor wafer substrate, but do not react prematurely on the reactor walls or upon themselves (e.g., auto-catalytic degradation and flocculation). Microwave heating helps to avoid some of the problems associated with unstable reactant liquids.

The use of an accumulation vessel in the feed conduit serves to decouple the delivery rate of reactive liquid to a reaction vessel from the heating rate of liquid before its delivery. Similarly, the use of a recycle accumulator vessel in the recycle conduit decouples the emptying rate of liquid from the reaction vessel from the cooling rate of liquid in the recycle conduit before it is cooled and returned to the main reservoir.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which.

DESCRIPTION OF THE INVENTION

Figure 1:
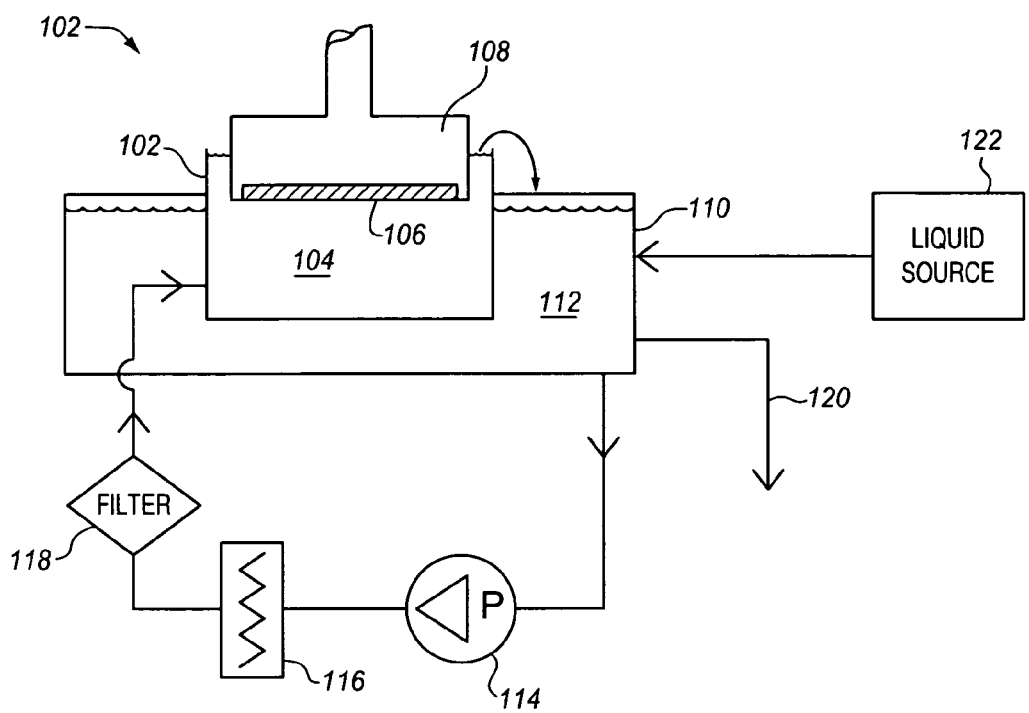
FIG. 1 depicts schematically a generalized conventional system of the prior art for conducting electroless plating.

The invention is described herein with reference to FIGS. 2-10. It should be understood that the structures and systems depicted in schematic form in FIGS. 2-9, serve explanatory purposes and are not precise depictions of actual structures and systems in accordance with the invention. Furthermore, the embodiments described herein are exemplary and are not intended to limit the scope of the invention, which is defined in the claims below. For the sake of clarity, in the figures and descriptions below, identical reference numerals are used to refer to identical or similar elements of various embodiments in accordance with the invention.

The terms "liquid treatment", "treatment", and related terms are used in a broad sense in this specification to designate any treatment of an integrated circuit substrate using a liquid phase, including, for example, pre-treatment operations, cleaning techniques, liquid chemical reactions, rinsing, drying, and post-treatment operations. The term "liquid chemical-reaction treatment" and similar terms are also used in a narrower sense and refer to a treatment conducted at the treatment surface of an integrated circuit substrate involving chemical reaction; for example, deposition, etching, and polishing operations. Broad categories of liquid chemical-reaction treatments include electroless metal plating, electroless etching, electrolytic plating, electrolytic etching, metal-oxide deposition, and liquid dielectric deposition. The term "reactant liquid" and similar terms refer to a liquid useful for liquid reaction treatment in accordance with the invention. An example of a reactant liquid is an electroless plating solution.

The term "dynamically variable" and related terms means that a variable or parameter of an apparatus, method, or composition is variable during a treatment process.

The term "closed" and related terms is used broadly to designate a space in a container that is substantially enclosed. For example, in some embodiments, a carrier/wafer assembly creates a seal with the sidewalls of a microcell container. This inhibits exposure of liquid in the treatment space to oxygen-containing air. In other embodiments, a fluid-tight seal is not established, but the carrier/wafer assembly effectively inhibits evaporation or other undesired escape of liquid present in the treatment space and also reduces exposure of liquid to air.

The term "inject fluid" and related terms used with respect to flowing a fluid such as an electroless plating solution into a vessel or chamber in this specification are used broadly to refer to several different types of fluid-flowing operations. In one sense, flowing liquid or gas into a container means simply injecting fluid into the container. Then, after a desired volume of fluid has been injected, flow ceases. Alternatively, fluid continues flowing at the same flow rate or continues at a different flow rate. In a second sense, therefore, flowing liquid or gas into a space means continuously flowing fluid, either at steady-state or at an unsteady state, into an enclosed space and out of the space at a corresponding flow rate. It is a feature of some embodiments in accordance with the invention that a fluid treatment can be conducted by injecting fluid into a container and forming a small fluid-treatment volume, and then ceasing flow for a period of time, thereby conducting essentially a batch operation. On the other hand, continuous flow operations are conducted in some embodiments.

The term "treatment space" and "reaction space" are used interchangeably to refer to a particular space in a reaction vessel in which chemical liquid reaction treatment is conducted.

Figure 2:
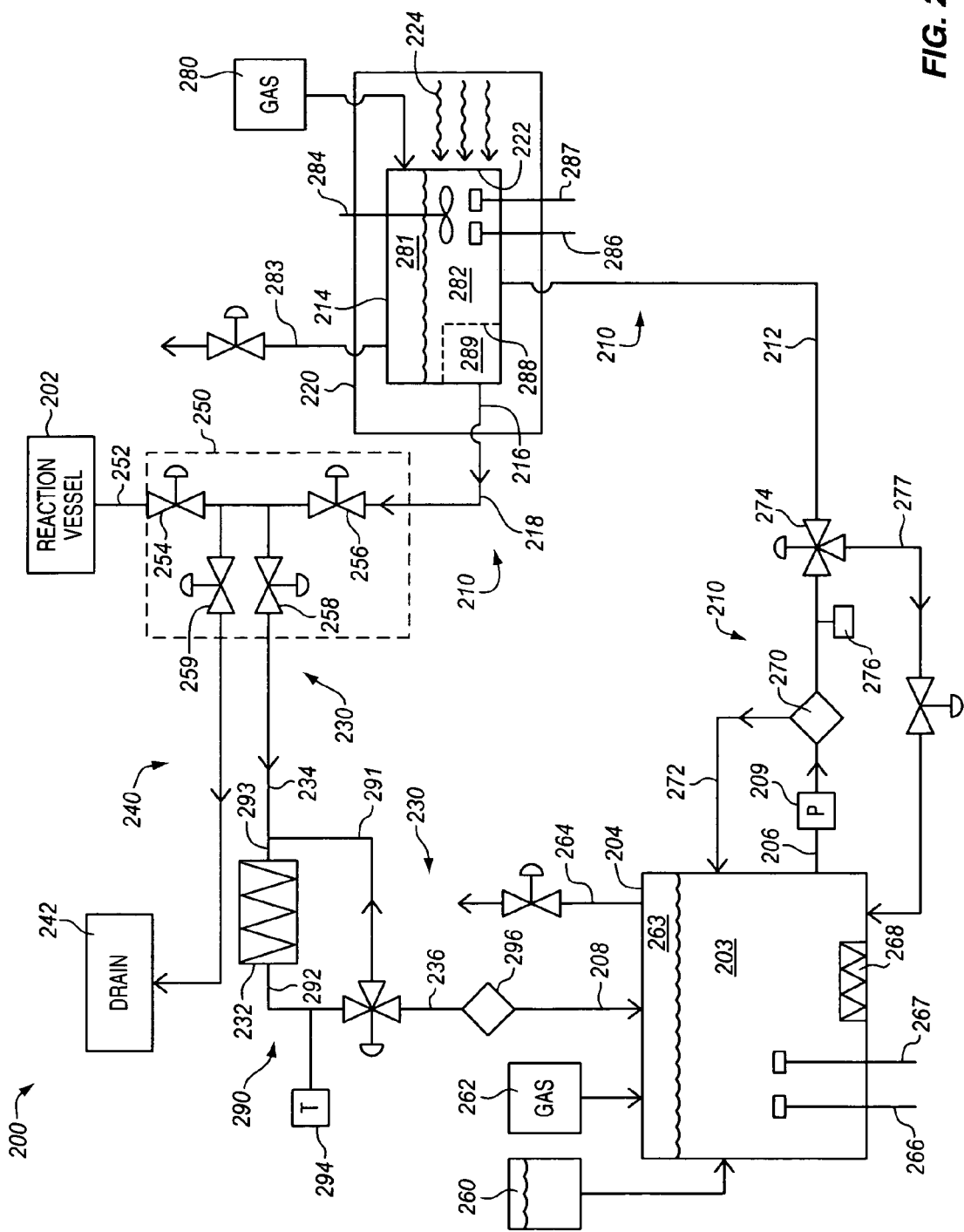
FIG. 2 depicts schematically a system in accordance with the invention for managing chemical-reaction treatment liquid and for conducting liquid treatment of an integrated circuit substrate.

FIG. 2 depicts schematically a system 200 in accordance with the invention for managing chemical-reaction treatment liquid and for conducting liquid treatment of an integrated circuit substrate. System 200 is described herein mainly with reference to electroless plating of metal on a substrate. It is understood, however, that a system in accordance with the invention is suitable for conducting liquid treatment of an integrated circuit substrate using various other techniques besides electroless plating. System 200 comprises a reaction vessel 202 and a main reservoir 204 for holding cooled reactant liquid 203. Preferably, reaction vessel 202 includes a small-volume reaction space. Preferably, reaction vessel 202 is operable to be closed to the atmosphere. Main reservoir 204 typically holds a significant portion of the total amount of reactant liquid in the system. Preferably, as depicted in FIG. 2, main reservoir 204 is operable to be closed to the atmosphere. A closed main reservoir 204 inhibits evaporation of reactant liquid 203. A closed main reservoir 204 also reduces or eliminates exposure of reactive liquid to oxidizing gases, such as air. A closed main reservoir 204 also reduces or eliminates uncontrolled escape of evaporate from reservoir 204. Reservoir 204 comprises a reservoir outlet 206 and a recycle inlet 208. System 200 further comprises a feed pump 209 and feed conduit 210, which fluidically connects reservoir outlet 206 with reaction vessel 202. Feed conduit 210 includes feed tubing connected to reservoir outlet 206.

In preferred embodiments in accordance with the invention, as depicted in FIG. 2, system 200 comprises an accumulation vessel 214 for holding and processing reactant liquid before it enters reaction vessel 202. Preferably, as depicted in FIG. 2, accumulation vessel 214 is operable to be closed to the atmosphere. Accumulation vessel 214 is integrated into feed conduit 210, which provides a continuous flow path for reactant liquid from reservoir 204 to reaction vessel 202. Accordingly, an outlet port 216 of accumulation vessel 214 is connected by feed tubing 218 to reaction vessel 202. System 200 also comprises heater 220 for heating reactant liquid in feed conduit 210. Preferably, heater 220 of system 200 is a microwave heater substantially enclosing accumulation vessel 214, which is included in feed conduit 210. At least a portion 222 of accumulation vessel 214 is transparent to microwave energy, indicated by arrows 224. Two advantages of the microwave heater compared to some other types of heaters are the elimination of a thermal differential for the purpose of heating, and a more rapid heating profile for a given small over-temperature constraint. In preferred embodiments in accordance with the invention, reactant liquid is heated in an accumulation vessel 214 of feed conduit 210 rather than in other tubing sections of feed conduit 210, such as tubing 212, 218. The accumulated volume of liquid reactant in accumulation vessel 214 allows the delivery rate of heated fluid to reaction vessel 202 to be decoupled from the heating rate, thereby allowing the use of a smaller microwave heater or other heat source. Vessel 214 is manufactured from process compatible materials, such as Teflon®, PVDF, or ECTFE. It is understood that other types of heaters in addition to or instead of a microwave heater are suitable for heating reactant liquid in feed conduit 210. It is also understood that one or more heaters can be located to heat liquid at a location in feed conduit 210 other than at an accumulation vessel.

System 200 further comprises a recycle conduit 230 fluidically connecting reaction vessel 202 with recycle inlet 208 of main reservoir 204. System 200 further includes in-line recycle cooler 232. Preferably, as depicted in FIG. 2, recycle cooler 232 is integrated into recycle conduit 230, which provides a continuous flow path for reactant liquid from reaction cell 202 to main reservoir 204. Recycle conduit 230 includes recycle tubing 234 and recycle tubing 236.

System 200 also comprises a drain conduit 240, which connects reaction vessel 202 to a liquid disposal system. System 200 comprises a manifold 250, which connects a fluid port 252 of reaction vessel 202 to feed conduit 210, recycle conduit 230 and drain conduit 240. Manifold 250 comprises variable fluid-flow control valves 254, 256, 258 and 259.

Liquid reactant source 260 is connected to main reservoir 204 to replenish reactant liquid in system 200, as necessary. System 200 also comprises purge-gas source 262, typically comprising compressed nitrogen gas, or other means, for purging air and other gases (especially oxygen-containing gases) from the gaseous space 263 above reactant liquid 203 in closed reservoir 204. Purging inhibits oxidation of reactant liquid and also reduces the concentration in gaseous space 263 of any gases that vaporize out of reactant liquid. A vent 264 enables venting of gases out of main reservoir 204; for example, purging gas and pressurizing gas provided by gas source 262, or gases that accompany treatment liquid that enters main reservoir 204 from liquid reactant source 260 and recycle conduit 230. Typically, sensors 266, 267 are located in reservoir 204 to monitor the temperature, pH and other properties of reactant liquid 203 in reservoir 204. System 200 comprises a filter 270 (or cascade of filters) integrated in feed conduit 210 for filtering particulate matter out of reactant liquid as it flows from reservoir 204 towards reaction vessel 202. Preferred embodiments, as depicted in FIG. 2, include a regeneration filter-loop 272, which allows reactant liquid to be continuously filtered, even when no reactant liquid is flowing past fluid control valves 274 towards reaction vessel 202. System 200 comprises a particle counter 276 for monitoring the presence of undesired particles in reactant liquid in feed conduit 210. System 200 further comprises a post-monitor regeneration loop 277 for recirculating reactant liquid back to main reservoir 204 before feed continues flowing in feed conduit 210 towards reaction vessel 202. A reservoir cooler 268 is also located in reservoir 204.

System 200 further comprises inert-gas (e.g., $N_2$, argon helium) source 280 or other means for purging air and other gases out of gaseous space 281 located above heated reaction liquid 282 in accumulation vessel 214. A vent 283 enables venting of gases out of accumulation vessel 214; for example, purging gas and pressurizing gas provided by gas source 280, or gases contained in treatment liquid that enters accumulation vessel 280. Gas source 280 also provides a means for pressurizing accumulation vessel 214, which facilitates injection of heated reactant liquid into reaction vessel 202. Mixer 284 provides a stirring function for chemical homogenization, forced thermal mixing and other appropriate effects. Sensors 286, 287 are located in accumulation vessel 214 to monitor the temperature, pH and other properties of heated reactant liquid 282. Preferably, embodiments in accordance with the invention comprise a means for de-bubbling reactant liquid in feed conduit 210 before it enters reaction vessel 202. For example, as depicted in FIG. 2, a porous membrane 288 (or series of membranes) is located in accumulation vessel 214. Porous membrane 288 helps to remove bubbles and also defines a stilling chamber 289 within accumulation chamber 214. Suitable porous membranes are commercially available from Porex Corporation, Fairburn, Ga. Alternatively, a filter having a small pore size, for example, a 0.05 micrometer (μm) pore size, is suitable for removing bubbles from reactant liquid before it exits accumulation vessel 214 through outlet 216.

System 200 also includes cooling loop 290 comprising cooler 232 and cooling recirculation tubing 290, which provides recirculation of cooled reactant liquid from outlet 292 of recycle cooler 232 back to inlet 293 of cooler 232. Preferably, cooling loop includes a temperature sensor 294 for determining when the reactant liquid in cooling loop 290 has been sufficiently cooled to a set-point temperature for return to main reservoir 204. Preferably, as depicted in FIG. 2, recycle filter 296 (or cascade of filters) is located in recycle conduit 230 to filter undesired particulate matter out of cooled reactant liquid before it flows into main reservoir 204.

Reaction vessel 202 preferably comprises a reaction space having a small reaction volume compared to the volume of liquid in main reservoir 204. Typically, accumulation vessel 214 has an accumulation-liquid volume in a range of about from one to three times the volume of a small reaction volume of each reaction vessel 202 supplied with liquid from accumulation vessel 214.

System 200 is capable of conducting liquid treating of a substrate in reaction vessel 202 in three basic modes of operation. In a single-use mode of operation, cool reactant liquid (e.g., electroless plating solution) flows from main reservoir 204, is preheated, and is injected into reaction vessel 202. After wafer treatment, the reactant liquid is routed from reaction vessel 202 through drain conduit 240 to drain system 242 for post-processing by the appropriate abatement systems. To make up for the continued depletion of reactant liquid, the reactant liquid in main reservoir 204 is either continuously or intermittently replenished via liquid source 260 to sustain continued operations. The advantage of this operational mode is that every wafer is exposed to the exact same chemical conditions, while the disadvantage is the high level of chemical consumption.

In a batch-use mode of operation, cool reactant liquid (e.g., electroless plating solution) flows from main reservoir 204, is preheated, and is injected into reaction vessel 202, as described above. However, after wafer treatment, the reactant liquid is cooled in recycle cooler 232 and returned to cold reservoir 204 via recycle conduit 230. Except for a small amount of reactant liquid usually rinsed from the substrate wafer and discarded with rinsate through drain conduit 240, nearly all the plating solution is recaptured. As a result, there is practically no need to replenish cold reservoir 204 with fresh reactant liquid after wafer treatment. Eventually, however, the repeatedly recycled plating solution degrades to the point that it is no longer useable (due to auto-degradation, constituent depletion, or other deleterious effects). At this point, the entire bath of main reservoir 204 is emptied to drain (not shown), and reservoir 204 is rinsed and refilled with fresh plating solution. Then, the entire cycle is repeated. An advantage of this operational mode is the low amount of chemical consumption (relative to single-use mode), while a disadvantage is the cyclical chemical degradation and attendant possibility of varying film performance ("first-wafer" and wafer-to-wafer effects).

In the preferred "bleed-and-feed" mode of operation, cool reactant liquid (e.g., plating solution) flows from main reservoir 204 to reaction vessel 202 and is heated prior to use. After wafer treatment, a major, recycle portion of the treatment liquid is returned to cold reservoir 204 via recycle conduit 230, as described above, while a minor, drain portion is diverted ("bled") via drain conduit 240 to drain 240. To make-up for the diverted drain portion, fresh reactant liquid is then added to main reservoir 204 at a bleed-and-feed rate. In this manner of operation, the useful life of the reactant liquid may be extended over the single-use mode without the adverse "first-wafer" or wafer-to-wafer effects of batch-mode operations. Also, similar to single-use mode, once the operating time has exceeded the bath time constant, (equal to the system's total liquid volume divided by the bleed-and-feed rate), every wafer is exposed to exactly the same chemical conditions.

As depicted in FIG. 2, a system in accordance with the invention preferably includes an active (possibly passive) in-line cooling element to cool reactant liquid after liquid treatment in reaction vessel 202, and prior to recycling of liquid to main reservoir 204. Such a cooling device 232 or sub-system cools the reactant liquid in a single pass, or alternatively the liquid is recirculated in a cooling loop 290 during the treatment of a subsequent wafer. In the case of a recirculation cooling loop, it is important that components be sized such that the total volume within the cooling loop exceeds the anticipated maximum liquid volume of the reaction vessel (e.g., electroless plating chamber) to allow all liquid flowing from the reaction vessel to fit within the loop. The cooling system preferably includes temperature feedback to ensure that the fluid is at set-point prior to diversion to cold main reservoir 204.

Fluid system 200 is designed such that it is essentially a closed system to minimize the amount of fluid evaporation and constituent loss. Cool reservoir 204 is preferably designed as a closed vessel. Within the heated portion of the fluid system, the only portion exposed to the atmosphere typically is in reaction vessel 202. If employed, accumulation vessel 214 is designed as a closed vessel.

Fluid filters generally are located as depicted in FIG. 2 in feed conduit 210 and in recycle conduit 230. Other potentially suitable locations for filtration elements include the inlet to accumulation vessel 214 and the inlet to reaction vessel 202. Preferably, filters are located in the cool sections of the fluid system to retard the rate of particle growth. While not shown in the schematic of FIG. 2, some embodiments provide filter regeneration, parallel filtration, or cascaded filtration capabilities. Such features extend the service or periodic-maintenance interval of the treating system.

An exemplary filter regeneration scheme extends filter service life in "dirty" environments. Such a system provides two or more filters in parallel so that while one filter is in service, the other filter is back-flushed to drain to clean the filter. Back-flushing preferably is accomplished with a metal etching solution (e.g. a mixture of hydrogen peroxide and sulfuric acid for copper or cobalt electroless plating) to dissolve any entrapped metal particles. After the etch, the filter is thoroughly flushed with deionized water, and then flushed with plating solution (perhaps as part of the bleed-and-feed cycle). The system is designed such that the filter life exceeds the filter regeneration cycle-time. To achieve this, either additional parallel filters or cascaded filters (a series of filters with sequentially decreasing pore size) are utilized.

Figure 3:
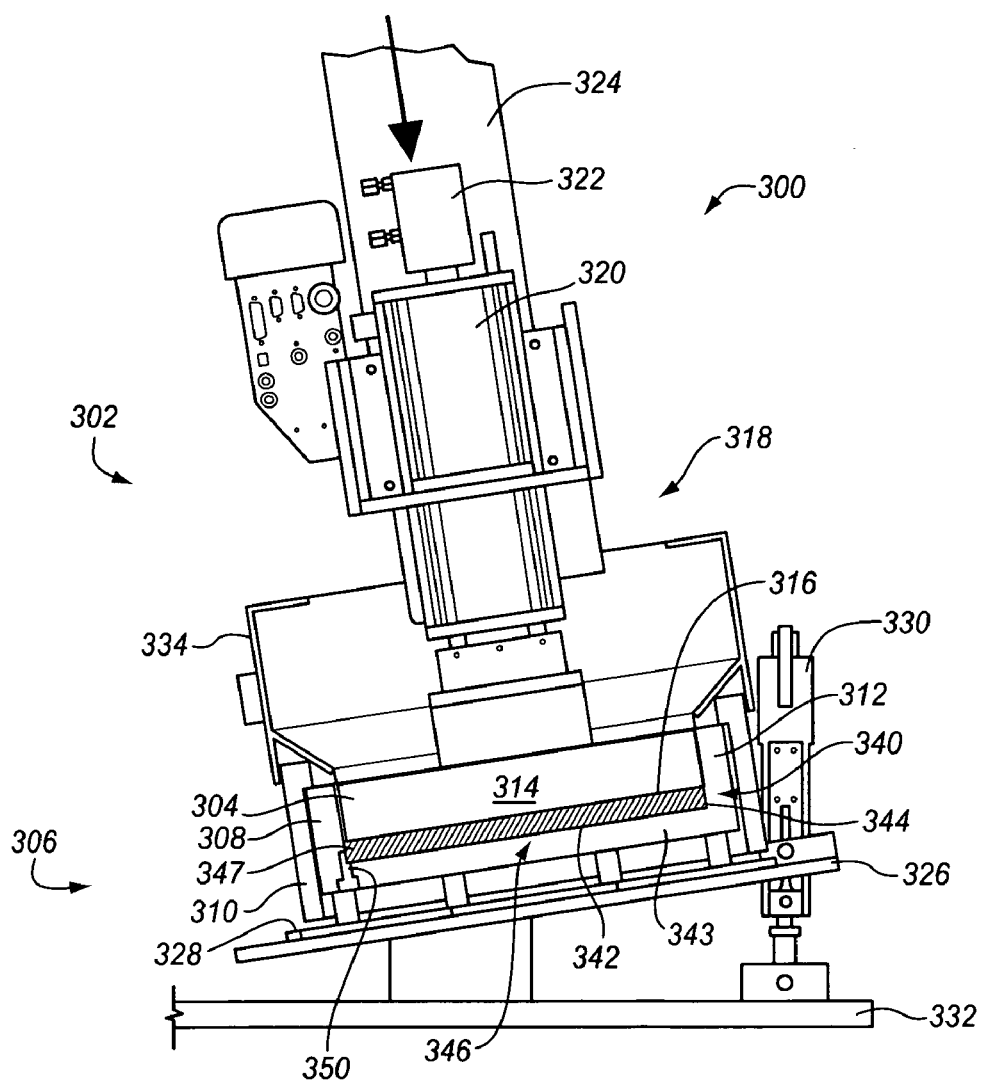
FIG. 3 depicts a perspective view of a microcell apparatus useful as a reaction vessel in accordance with the present invention.

A wide variety of liquid-reaction vessels are suitable for use in a liquid-management and treatment system in accordance with the invention. Preferably, a reaction vessel used in accordance with the invention functions using a relatively small liquid-treatment volume compared to the total volume of reaction liquid in the system. Co-owned and co-pending United States patent application by Feng et al., having the title "Small-Volume Electroless Plating Cell", which is incorporated by reference, teaches an apparatus suitable for electroless plating or other fluid treatment of an integrated circuit substrate. FIG. 3 depicts a cross-sectional view 300 of a microcell apparatus 302 as taught by Feng et al., which is useful as a reaction vessel in accordance with the present invention. FIG. 3 depicts carrier/wafer assembly 304 of apparatus 302 in a lowered, plating position. Microcell apparatus 302 comprises a heated microcell unit 306. Microcell unit 306 includes a microcell container 308 and an outer-perimeter thermal insulator 310 surrounding the cylindrical sidewall 312 of the container 308. Microcell apparatus 302 further comprises a substrate carrier 314 for holding a substrate wafer 316. Substrate carrier 314 is part of substrate holder assembly 318. Substrate holder assembly 318 includes a rotation drive 320 for rotating substrate carrier 314. Substrate holder assembly 110 further includes a rotary union 322, which accommodates conduits for vacuum and electrical power. Substrate carrier 314 preferably provides a barrier to heat leaving through the backside of a substrate wafer. Slip rings (not shown) proximate to rotation drive 320 help provide electrical power for heating a substrate carrier. Microcell apparatus 302 further includes a vertical lift 324 for translating rotation drive 320 and substrate carrier 314 into and out of heated microcell unit 306. Preferably, vertical lift 324 provides tailored motion profiles to mitigate splashing, bubbles and other problems typically encountered during immersion of a substrate wafer into wet chemistry. Microcell apparatus 302 further comprises tilt table 326 on which microcell unit 306 is mounted via mounting plate 328. Vertical lift 324 and thereby substrate holder assembly 318 are also mounted on tilt table 326. A tilt actuator 330 is mounted on a horizontal base plate 332 and is functionally connected to tilt table 326. Various embodiments of devices suitable for serving as a tilt actuator are known in the art. As depicted in FIG. 3, tilt actuator 330 is spring-assisted and is typically capable of tilting tilt table 326 to an angle in a range of about from zero to 20°, thereby tilting microcell unit 306, substrate holder assembly 318 and vertical lift 324 at the same angle. FIG. 3 also depicts rinse shield 334 located substantially above microcell unit 306. Carrier/wafer assembly 304 forms a thin enclosed treatment space 340 defined by carrier/wafer assembly 304 (including wafer 316), by inside bottom surface 342 of container bottom wall 343, and by inside sidewall surface 344 of container sidewall 312. Thin enclosed treatment space 340 is filled by liquid treatment-volume 346 of reactant liquid 347. Thin enclosed treatment space 340 and corresponding treatment volume 346 generally comprise a volume in a range of about from 25 ml (milliliter) to 2000 ml, more typically in a range of about from 100 ml to 500 ml. Reactant liquid 347 is injected into microcell container 308 and removed from container 308 via fluid port 350.

Microcell container 308 comprises a significant mass of a highly conducting material with a heat capacity substantially greater than that of a substrate wafer. Generally, the total (not specific) heat capacity of the microcell container is designed to be more than 10 times greater than that of a substrate, and the thermal conductivity of the heating mass in the container walls is designed to be high, generally greater than 0.2 Watt $cm^{-1}K^{-1}$. Examples of suitable materials are metals such as Copper (Cu), Aluminum (Al), Titanium, stainless steel, and Iron, particularly Aluminum and Copper.

Metrology for monitoring and controlling reactant liquid properties (e.g., composition, temperature, pH) and process conditions (e.g., fluid flow rates, temperature, pressure) may be added anywhere within the liquid management system as required. Because electroless plating processes typically are conducted at temperatures above 50° C., it is advantageous (but not necessary) to locate metrology in the cold portions of the fluid system. By so locating metrology, thermal variations are minimized or eliminated. Also, because many favored materials are not compatible with elevated processing temperatures, a broader range of metrology components is available for use within the system at cooler temperatures.

Figure 4:
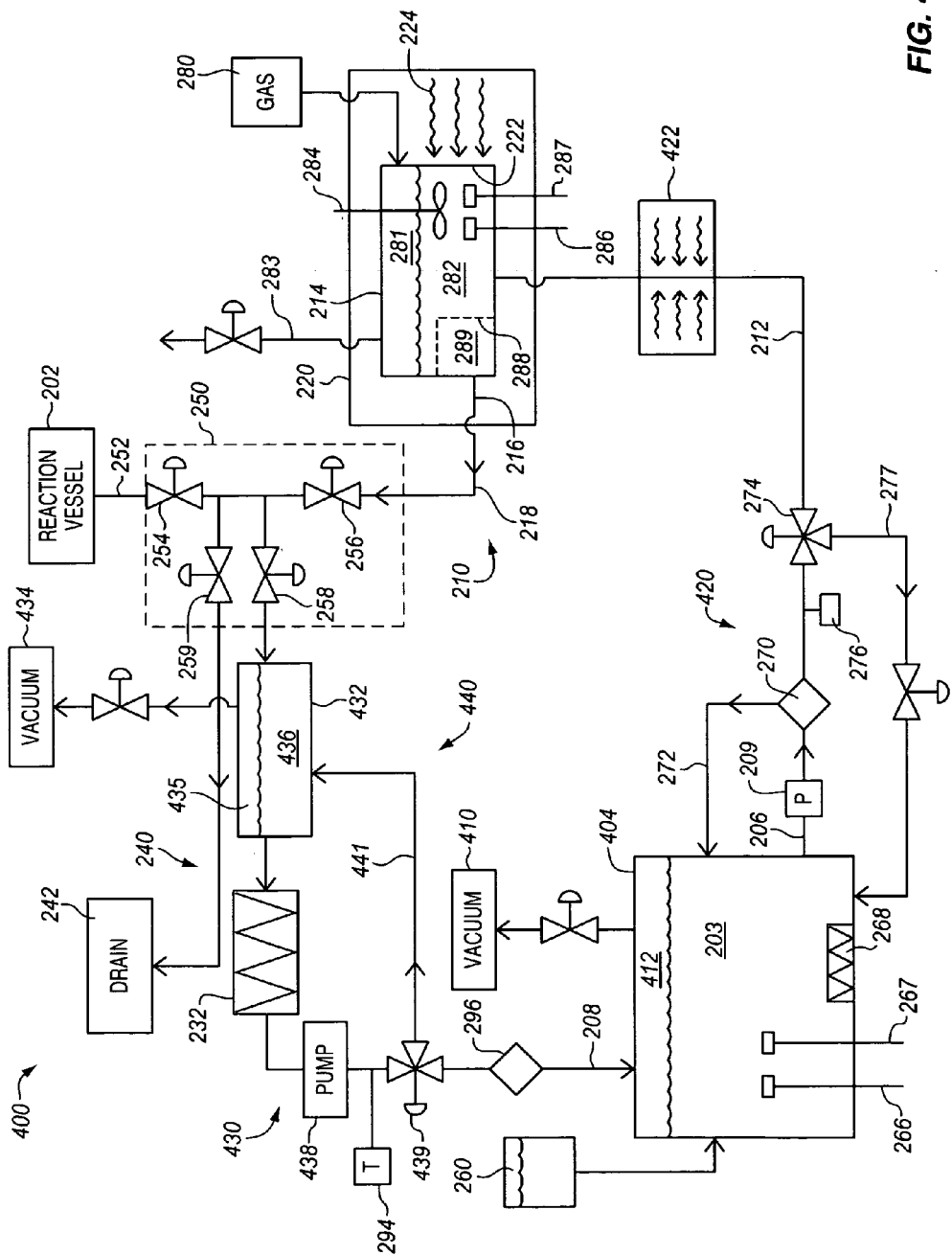
FIG. 4 depicts schematically a system in accordance with the invention for managing chemical-reaction treatment liquid and for conducting liquid treatment of an integrated circuit substrate.

FIG. 4 depicts schematically a system 400 in accordance with the invention for managing chemical-reaction treatment liquid and for conducting liquid treatment of an integrated circuit substrate. System 400 is described herein mainly with reference to electroless plating of metal on a substrate. It is understood, however, that a system in accordance with the invention is suitable for conducting liquid treatment of an integrated circuit substrate using various other techniques besides electroless plating. System 400 comprises a reaction vessel 202 and a main reservoir 404 for holding cooled reactant liquid 203. Main reservoir 204 typically holds a significant portion of the total amount of reactant liquid in the system. As depicted in FIG. 4, reservoir 204 is closed to the atmosphere to inhibit evaporation of reactant liquid 203 and to reduce or eliminate exposure of reactive liquid to oxidizing gases, such as air. System 400 further comprises reservoir vacuum system 410 for drawing a partial vacuum in main reservoir 404. By drawing a partial vacuum, for example, by pumping the pressure in main reservoir of 404 down to about 0.1 atmosphere (atm), absorption of gases from void space 412 into reactant liquid 203 is substantially inhibited. Also, a partial vacuum decreases the solubility of gases in cool reactant liquid, thereby drawing any dissolved gases out of solution.

As depicted in FIG. 4, system 400 comprises accumulation vessel 214 for holding and processing reactant liquid before it enters reaction vessel 202. Preferably, as depicted in FIG. 4, accumulation vessel 214 is operable to be closed to the atmosphere. Accumulation vessel 214 is integrated into feed conduit 420, which provides a continuous flow path for reactant liquid from reservoir 404 to reaction vessel 202. System 400 also comprises heater 220 for heating reactant liquid in feed conduit 420. Heater 220 of system 400 is a microwave heater substantially enclosing accumulation vessel 214, which is included in feed conduit 420. System 400 further includes in-line heater 422 for partially heating reactant liquid in feed conduit 420 before the reactant liquid enters accumulation vessel 214. The accumulated volume of liquid reactant in accumulation vessel 214 allows the delivery rate of heated fluid to reaction vessel 202 to be decoupled from the heating rate. This allows the use of less-powered heaters 220, 422 or other heat source than if reactant liquid were to flow directly from main reservoir 404 to reaction vessel 202 during a short delivery time and if the liquid were heated from the relatively cool reservoir-temperature to a reaction temperature during the short delivery time.

System 400 further comprises a recycle conduit 430 fluidically connecting reaction vessel 202 with recycle inlet 208 of main reservoir 404. System 400 further includes recycle accumulator vessel 432 in recycle conduit 430 into which reactant liquid exiting reaction vessel 202 is emptied. In preferred embodiments, as depicted in FIG. 4, system 400 further includes recycle vacuum system 434 for making a partial vacuum in recycle accumulator vessel 432. By drawing a partial vacuum, for example, a pressure of 0.1 atm, in recycle accumulator vessel 432, gases are substantially removed from void space 435, and absorption of gases from void space 435 into reactant liquid 436 is substantially inhibited. System 400 further comprises in-line recycle cooler 437 followed by recycle pump 438 in recycle conduit 430. For cooling of recycled reactant liquid before it returns to main reservoir 404, system 400 includes a cooling loop 440, which includes recycle accumulator vessel 432, cooler 232, pump 438 and cooling recirculation tubing 441. Reactant liquid 436 flows from recycle accumulator vessel 432 into recycle cooler 437. Appropriate operation of recycle valve 439 allows recirculation of reactant liquid through cooling recirculation tube 441 back to recycle accumulator vessel 432. This allows decoupling of emptying reactant liquid out of reaction vessel 202 from the rate of cooling in recycle conduit 430. As a result, reactant liquid can be emptied out of reaction vessel 202 at a relatively fast emptying rate, and the reactant liquid can then be cooled at a relatively slow cooling rate in cooling loop 440 of recycle conduit 430 before being recycled into main reservoir 404. Consequently, the power and size requirements of recycle cooler 437 are less than if cooling of liquid from the reaction temperature of reaction vessel 202 to the relatively cool reservoir temperature had to be effected during a relatively short residence time of reactive liquid in a recycle conduit having no accumulator vessel. The total volume of recycle accumulator vessel 432 and the rest of cooling loop 440 is preferably at least 100% of the liquid volume of reaction vessel 202. Recycle accumulator vessel 432 typically includes a vent port to allow filling and draining of reactant.

Reaction vessel 202 preferably comprises a reaction space having a small reaction volume compared to the volume of liquid in main reservoir 404. Typically, accumulation vessel 214 has an accumulation-liquid volume in a range of about from one to three times the volume of a small reaction volume of each reaction vessel 202 supplied with liquid from accumulation vessel 214.

Exemplary, nonexclusive values of parameters of a liquid management system 400 in accordance with the invention comprise:
Total system liquid volume: 10 liters (L)
Main reservoir, total liquid capacity: 12 L
Main reservoir, working liquid volume: 6 L
Accumulation vessel, total liquid capacity: 2 L
Accumulation vessel, working liquid volume: 1 L
Reaction vessel, liquid treatment volume: 500 mL
Recycle accumulator vessel, total liquid capacity: 2 L
Recycle accumulator vessel, working liquid volume: 1 L
Power of microwave heater: 2 to 10 kW
Cooling unit power: 500 to 2000 W The values shown above refer to an exemplary system 400 for electroless plating of cobalt on an integrated circuit wafer having a diameter of 300 mm, which system contains a single main reservoir 404, a single accumulation vessel 214, a single reaction vessel 202, and a single recycle conduit 430. In an exemplary embodiment, the total liquid volume in an operating system 400 is 10 liters. Since the total capacity of the main reservoir is generally greater than the total liquid volume of the system, the total liquid capacity of main reservoir 404 is 12 liters. During operation, the volume of reactant liquid 203 present in main reservoir 404 is typically about six liters. When the liquid treatment volume of reaction vessel 202 is about 500 mL, the volume of reactant liquid 282 in accumulation vessel 214 is generally greater than 500 mL and less than 1.5 L, typically about one liter. The total liquid capacity of accumulation vessel 214 is typically about 2 liters. Similarly, the total liquid capacity of recycle accumulator vessel 432 is about two liters, and the working liquid volume of reactant liquid 436 in accumulator vessel 432 during operation is about 1 liter. For heating cobalt plating solution having a flow rate of 1 liter per minute from about 0° C. to about 80° C., a microwave heater delivering about 6 kW is required.

The volumes and power requirements generally are different in other systems, depending on overall sizes and particular uses of various systems. For example, in a system having a single main reservoir and a single accumulation vessel connected to four reaction vessels that empty into a single recycle accumulator vessel, exemplary volumes and power level are: main reservoir working volume, 24 L; accumulation vessel working volume, 4 L; reaction-vessel liquid volumes, 500 mL each; recycle accumulator working volume, 4 L, heating power, 24 kW.

System 400 is capable of conducting liquid treating of a substrate in reaction vessel 202 in three basic modes of operation, as described above with reference to system 200.

Figure 5:
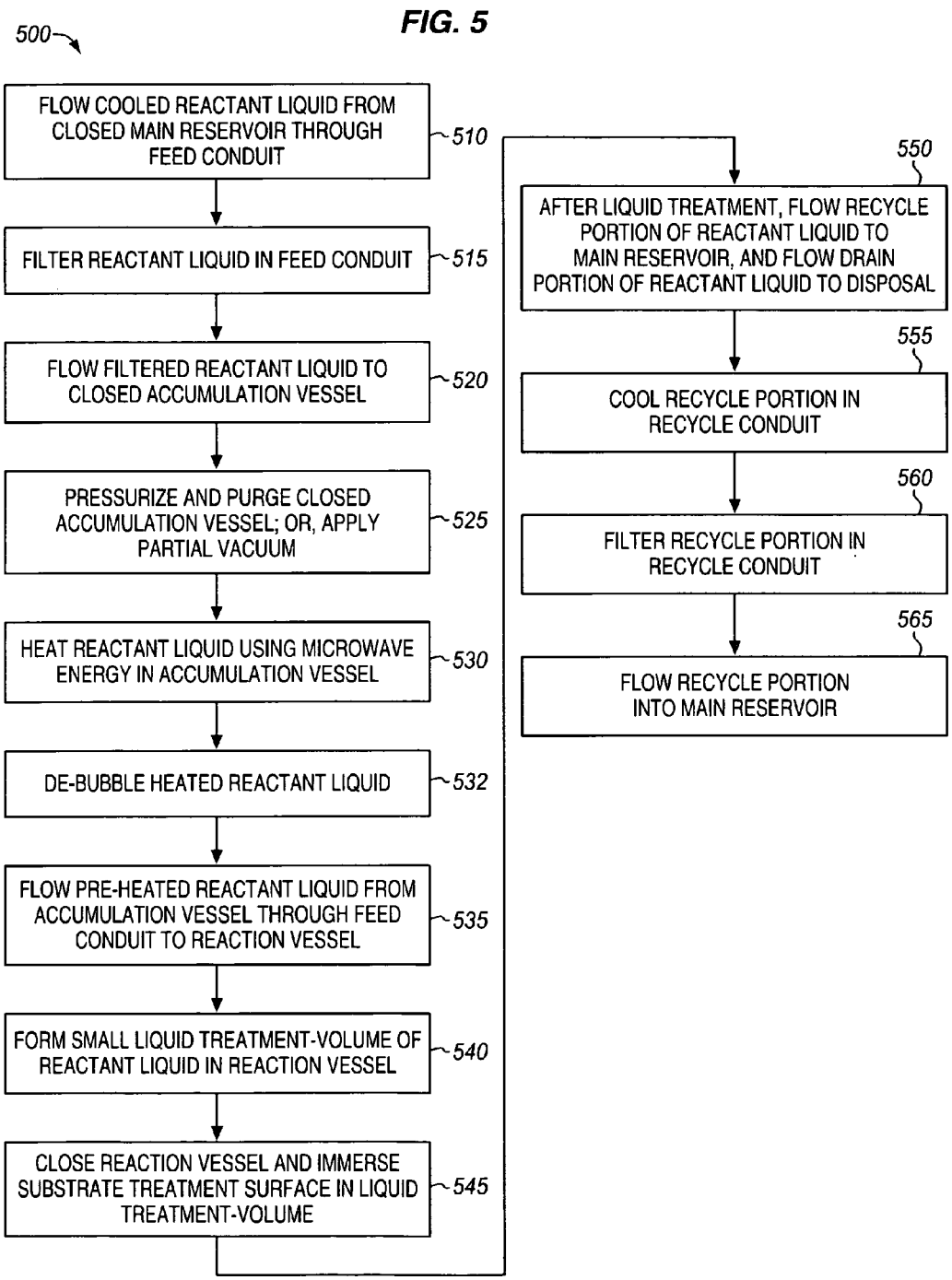
FIG. 5 contains a process flow sheet of a generalized method in accordance with the invention for conducting liquid treatment of a substrate surface using an apparatus in accordance with the invention.

FIG. 5 contains a process flow diagram of a generalized method 500 in accordance with the invention for conducting liquid treatment of a substrate surface using an apparatus in accordance with the invention. Although method 500 is described with reference to systems 200 and 400 depicted in FIGS. 2 and 4, respectively, it is understood that methods in accordance with the invention are conducted in other embodiments of an apparatus in accordance with the invention different from systems 200 and 400. It is understood that some embodiments of methods in accordance with the invention do not include all of the processes of method 500.

Processes 510 include flowing cooled reactant liquid from closed main reservoir 204, 404 through feed conduit 210, 420 towards reaction vessel 202. Processes 515 include filtering the reactant liquid through filter 270 (or through a cascade of filters) to remove undesired particulate matter from the reactant liquid. For example, as described above, undesired metal particles typically form in electroless plating solution and preferably are removed. Preferably, a particle counter 276 monitors the content of particles in the reactant liquid and provides data for feedback-control and recirculation of liquid requiring additional filtration. In processes 520, filtered reactant liquid is flowed into closed accumulation vessel 214. Processes 525 include pressurizing accumulation vessel 214 and also purging the gaseous space 281 above reactant liquid 282. Pressurizing and purging typically is conducted using pressurized inert gas 280, such as nitrogen or helium. Alternatively, processes 525 comprise connecting gaseous space 281 to a vacuum line to de-gas reactant liquid 282 and to remove gases released by heating of the liquid. Processes 530 include heating reactant liquid 282 in accumulation vessel 214 using microwave heater 220. Alternatively or additionally, one or more in-line heaters heat reactant liquid in feed conduit 210, 420 instead of or in addition to the heating in accumulation vessel 214. For example, in some embodiments, as depicted in FIG. 4, one or more in-line heaters 422 (preferably microwave heaters) heat reactant liquid in tubing 212 or tubing 218 of feed conduit 210, 420. Mixing the reactant liquid with a stirrer 284 enhances homogenization of reactant liquid 282.

Heating of reactant liquid decreases the solubility of gases, resulting in release of absorbed gases, which tends to form bubbles. Processes 532 include removing bubbles from heated reactant liquid 282. This is accomplished when reactant liquid flows through porous membrane 288 as it flows towards outlet port 216 of accumulation vessel 214. As described above, porous membrane 288 defines a stilling chamber 289, which enhances quiescence in the reactant liquid before it proceeds into reaction vessel 202. Alternatively or additionally, making a partial vacuum in accumulation vessel 214 by connecting it to a vacuum line forces gas out of solution and helps to remove gas bubbles from the liquid.

Processes 535 include flowing heated reactant liquid from accumulation vessel 214 through feed tubing 218 of feed conduit 210, 420 and through manifold 250 into reaction vessel 202. Heated reactant liquid flows through fluid port 252 into the reaction space of reaction vessel 202 to form a liquid treatment-volume of reactant liquid. Processes 540 include forming a liquid treatment-volume in reaction vessel 202. In preferred embodiments, the reactant liquid in reaction vessel 202 forms a relatively small liquid treatment-volume that has a small total heat capacity compared to the total heat capacity of reaction vessel 202. Processes 545 include closing the reaction vessel and immersing the treatment surface of the substrate in the liquid treatment-volume for reaction treatment; for example, for electroless plating of cobalt. A closed reaction vessel inhibits or prevents evaporation of reactant liquid. A closed reaction vessel also inhibits or prevents oxidation of reactant liquid. In some embodiments, processes 540 and/or 545 include removing gas from reaction vessel 202 by flowing purging gas through reaction vessel 202 or by drawing a vacuum using a pump. In some embodiments, drawing a vacuum in reaction vessel 202 also enhances the flow of reactant liquid from feed conduit 210 into reaction vessel 202.

After liquid treatment, in processes 550, reactant liquid is emptied from reaction vessel 202 and generally the substrate is rinsed with deionized water and/or with a rinsing solution. In single-use mode of operation, substantially all of the reactant liquid treatment volume flows out of reactant cell 202 through drain conduit 240 to disposal unit 242. After rinsing of the substrate, the rinsate containing a small amount of reactant liquid also empties through drain conduit 240. Alternatively, in batch-use mode of operation, nearly all of the reactant liquid treatment-volume is recycled as a recycle portion by flowing from reaction vessel 202 through recycle conduit 230, 430 towards main reservoir 204. After emptying reactant liquid from reaction vessel, the substrate is rinsed and a relatively small amount of reactant liquid exits the system in the rinsate through drain conduit 240. In a generally preferred bleed-and-feed mode of operation, processes 550 include flowing a recycle portion from reaction vessel 202 through recycle conduit 230, 430 towards main reservoir 204, and flowing (bleeding) a drain portion of the reactant liquid treatment-volume out of reactant cell 202 through drain conduit 240 to disposal unit 242. After rinsing of the substrate, the rinsate containing a small amount of reactant liquid also empties through drain conduit 240.

In batch mode and in bleed-and-feed mode of operation, processes 555 include cooling the recycle portion of reactant liquid in cooler 232. Practically, the volumetric capacity of tubing 234, cooler 232 and cooling recirculation tubing 291, as depicted in FIG. 2, is sufficient to accommodate all of the recycle portion of reactant liquid as it empties relatively quickly out of reaction vessel 202. In preferred embodiments, as depicted in FIG. 4, cooling loop 440 in recycle conduit 430 includes recycle accumulator vessel 432, which typically accommodates a liquid volume that is equal to or greater than the volume of the recycle portion. After reactant liquid in cooling loop 290, 440 has been cooled to a set-point temperature, it is flowed toward main reservoir 204, 404.

Processes 560 include flowing the recycle portion through filter 296 (or through a cascade of filters). In processes 565, the recycle portion of reactant liquid flows into main reservoir 204. It is understood that some embodiments of methods in accordance with the invention include sequences that are different from the sequence of method 500. For example, some embodiments include substantially closing a reaction vessel before reactant liquid flows into the reaction vessel. In other examples, a recycle portion is filtered before cooling of the recycle portion.

Figure 6:
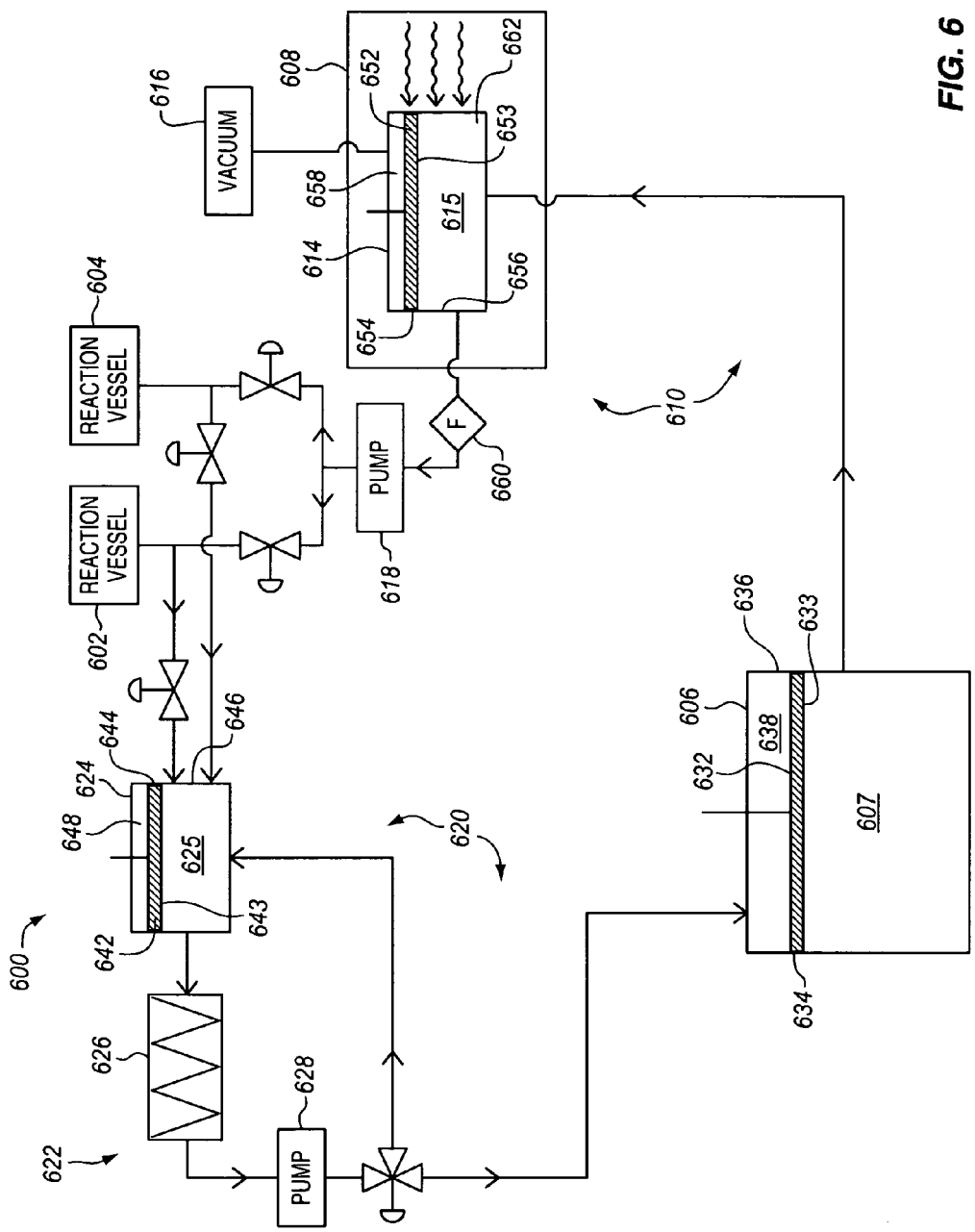
FIG. 6 depicts schematically a simplified process flow diagram of a system in accordance with the invention having a plurality of reaction vessels fluidically connected to a single main reservoir.

Systems 200, 400 depicted in FIGS. 2 and 4, respectively, contain a single cold reservoir 204, 404 and a single reaction cell 202. A manufacturing tool likely includes additional reaction vessels (e.g., electroless plating cells). For example, FIG. 6 depicts schematically a simplified process flow diagram of a system 600 in accordance with the invention having a plurality of reaction vessels 602, 604 fluidically connected to a single main reservoir 606 holding reactant liquid 607. To support multiplexed plating cells, microwave heater 608 typically has a capacity to heat more liquid quickly (operate at higher power) than is required when a heater is dedicated to a single reaction vessel. System 600 further includes feed conduit 610, which includes accumulation vessel 614 for accumulating and heating reactant liquid 615, inlet vacuum 616 and inlet pump 618. System 600 further includes recycle conduit 620, which includes cooling loop 622. Cooling loop 622 includes recycle accumulator vessel 624 holding liquid 625, cooler 626 and recycle pump 628. Preferred embodiments in accordance with the invention minimize exposure of reactant liquid to gaseous environments throughout the system in order to minimize undesired absorption of gases into the reaction liquid. This is especially important in regions of the liquid management system in which the reactant liquid is being cooled or is at a low temperature; for example, in main reservoir 606 and in cooling loop 622. Accordingly, main reservoir 606, accumulation vessel 614 and cooling accumulator vessel 624 in system 600 are designed to minimize or eliminate exposure of reactant liquid 607, 615, 625, respectively, to gas. As depicted in FIG. 6, main reservoir 606 includes reservoir piston 632, which rests on the flat surface 633 of reactant liquid 607 and which also creates a seal 634 with vessel wall 636. As a result, exposure of reactive liquid 607 to gaseous environment 638 above reactant liquid 607 and piston 632 is substantially prevented. Similarly, recycle accumulator vessel 624 includes accumulator piston 642, which rests on the flat surface 643 of reactant liquid 625 and which also creates a seal 644 with vessel wall 636. As a result, exposure of reactive liquid 625 to gaseous environment 648 above reactant liquid 625 and piston 642 is substantially prevented. Similarly, accumulation vessel 614 includes accumulation piston 652, which rests on the flat surface 653 of reactant liquid 615 and which also creates a seal 654 with vessel wall 656. As a result, exposure of reactant liquid 615 to gaseous environment 658 above reactant liquid 625 and piston 642 is substantially prevented. Inlet vacuum 616 connected to space 658 at the top of accumulation vessel 614 is useful for creating a partial vacuum (e.g., 0.1 atm pressure) in accumulation vessel 614 to reduce the partial pressure of gases in accumulation vessel 614 and thereby inhibit absorption of gases into reactant liquid 615. During heating of reactant liquid in inlet conduit 610, especially in accumulation vessel 614, absorbed gases are released out of the liquid. Gas filter 660 in feed conduit 610 between accumulation vessel 614 and pump 618 removes gas out of reactant liquid as it flows towards reaction vessels 602, 604. Alternatively, some embodiments include one or more gas vents in accumulation vessel 614 and at other locations of feed conduit 610. Inlet pump 618 is useful for pumping reactant liquid from accumulation vessel 614 to reaction vessels 602, 604, especially when accumulation vessel 614 is under partial vacuum. In other embodiments (not depicted), one or more of a main reservoir, of an accumulation vessel, and of a recycle accumulator vessel are designed so that the liquid capacity of the vessel expands or contracts as liquid enters or exits the vessel, respectively. For example, a vessel having a section with an accordion-like flexible bellows structure allows expansion and contraction of the volume of the vessel to accommodate changing liquid volumes without a gas-filled space above the liquid. Since the volume of the closed vessel changes to match the volume of liquid occupying it, reactant liquid in the vessel does not come in contact with a gas phase.

Figure 7:
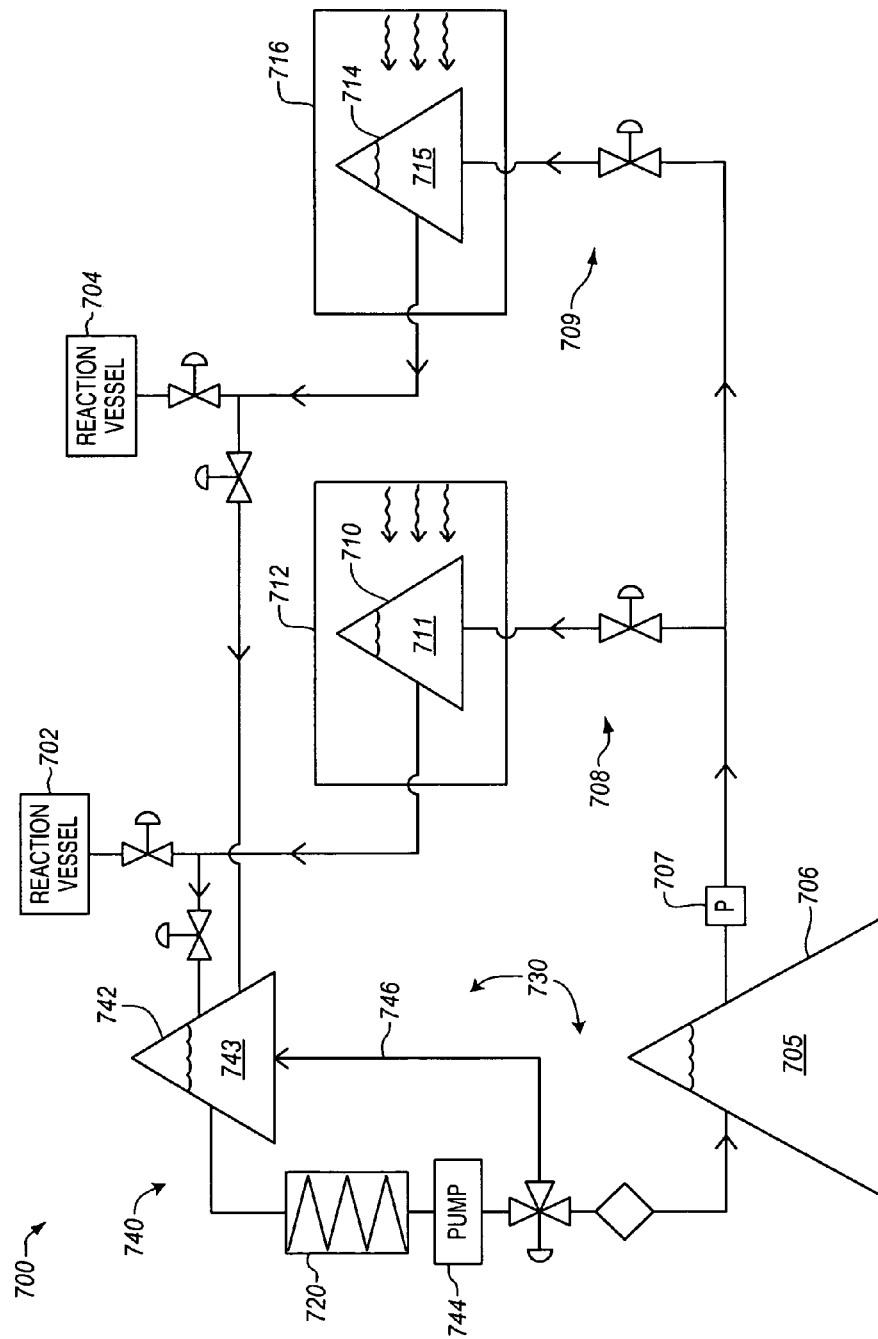
FIG. 7 depicts schematically a simplified process flow diagram of a system in accordance with the invention in which a plurality of reaction vessels are supplied with reactive liquid from a reservoir through a plurality of feed conduits.

FIG. 7 depicts schematically a simplified process flow diagram of a system 700 in which a plurality of reaction vessels 702, 704 are supplied with reactant liquid 705 from a reservoir 706 by pump 707 via feed conduits 708, 709, respectively. Feed conduit 708 includes accumulation vessel 710 (for holding reactant liquid 711) and microwave heater 712. Similarly, feed conduit 709 includes accumulation vessel 714 (for holding reactant liquid 715) and microwave heater 716. System 700 further includes in-line recycle cooler 720, which cools reactant liquid from reaction vessels 702, 704 before the liquid is returned to main reservoir 706. Recycle conduit 730 transports reactant liquid for recycling from reaction vessel 702, 704 to main reservoir 706. Recycle conduit 720 includes cooling loop 740. Cooling loop 740 includes recycle accumulator vessel 742 (for holding reactant liquid 743), cooler 720, recycle pump 744, and cooling recirculation to being 746. Preferred embodiments in accordance with the invention minimize exposure of reactant liquid to gaseous environments throughout the system in order to minimize undesired absorption of gases into the reaction liquid. This is especially important in regions of the liquid management system in which the reactant liquid is being cooled or is at a low temperature; for example, in main reservoir 706 and in cooling loop 740. Accordingly, main reservoir 706, accumulation vessels 710, 714 and recycle accumulator vessel 742 in system 700 are shaped to minimize or eliminate exposure of reactant liquid 705, 711, 715, and 743, respectively, to gas. As depicted in FIG. 7, vessels 706, 710, 714 and 742 are designed to minimize the interface between reactant liquid in the vessels and the gaseous space above the liquid, thereby inhibiting undesired absorption of gas into liquid. It is understood that some embodiments also include either purging gas and gas vents, or vacuum pumps, or both, connected to one or more of vessels 706, 710, 714 and 742, as described above with reference to FIGS. 2, 4 and 6.

Although embodiments in accordance with the invention are described herein mainly with respect to electroless plating techniques, it is clear that an apparatus and a method in accordance with the invention are useful for many types of wet substrate treatments. Various substrate treatments include liquid chemical reactions as well as non-reactive treatments (e.g., pretreatment cleaning and rinsing). Accordingly, exemplary reactant liquids in accordance with the invention include electroless plating solution and chemical etching solution. An example of a liquid chemical reaction treatment is the uniform etching of a substrate surface. Another example is the stripping of an oxide from a substrate surface. For example, a protective oxide layer or an oxide layer that simply formed in an oxidizing environment is stripped off before electroless plating operations begin. In another aspect, metal particles and other contaminants are cleaned from a substrate carrier, inside container walls, and other surfaces prior to liquid chemical reaction treatment. An advantage of using a system in accordance with the invention is that the process conditions are closely controlled and dynamically variable. Similarly, the composition of the liquid plating solution is dynamically variable.

Figure 8:
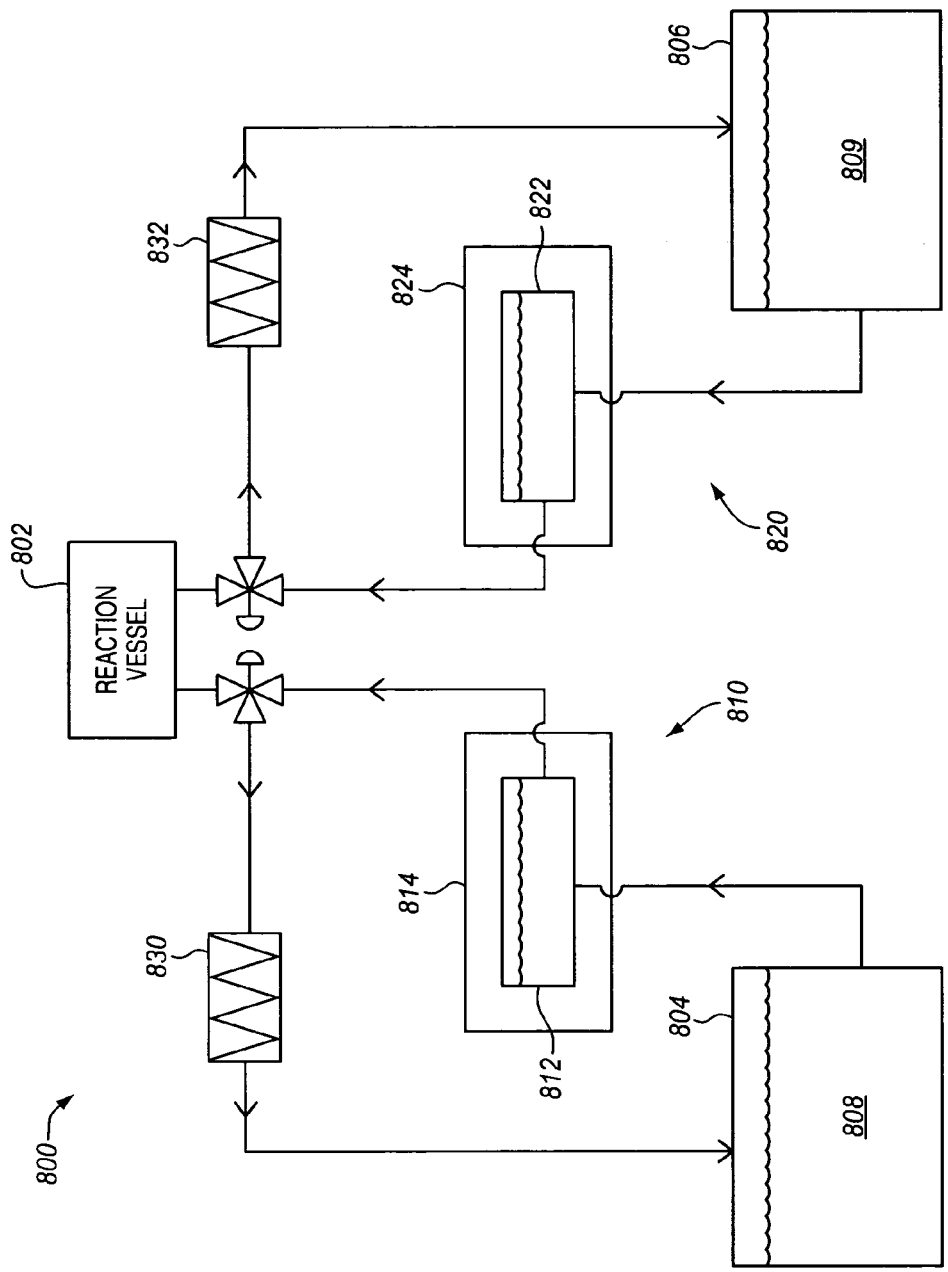
FIG. 8 depicts schematically a simplified process flow diagram of a system in accordance with the invention in which a reaction vessel is connected to a plurality of main reservoirs in parallel.

Embodiments in accordance with the invention are suitable for conducting liquid treatment of an integrated circuit substrate using a plurality of liquid-treatment phases. Some embodiments are suitable for conducting a plurality of liquid-treatment phases in a single reaction vessel. FIG. 8 depicts schematically a simplified process flow diagram of a system 800 in which a reaction vessel 802 is connected in parallel to a plurality of main reservoirs 804, 806. Typically, reservoir 804 contains reactant liquid 808 having a composition that is different from the composition of reactant liquid 809. Main reservoir 808 is connected to reaction vessel 802 through feed conduit 810. Feed conduit 810 includes accumulation vessel 812 and a microwave heater 814. Main reservoir 806 is connected to reaction vessel 802 through feed conduit 820. Feed conduit 820 includes accumulation vessel 822 and microwave heater 824. To conduct a first phase of a liquid treatment of an integrated circuit substrate in reaction vessel 802, reactant liquid 808 is injected into reaction vessel 802 after being heated in accumulation vessel 812. After completion of the first phase of liquid treatment, reactant liquid 808 is recycled from reaction vessel 802 through recycle cooler 830 back into main reservoir 808. To conduct a second phase of a liquid treatment, reactant liquid 809 is injected into reaction vessel 802 through feed conduit 820 after heating in accumulation vessel 822. After completion of the second phase of liquid treatment, reactant liquid 809 is recycled from reaction vessel 802 through recycle cooler 832 back into main reservoir 809. It is understood that additional main reservoirs are added to system 800 to conduct additional phases of liquid treatment. For example, co-owned and co-pending U.S. patent application Ser. No. 10/609,518, filed Jun. 30, 2003, by Mayer et al., which has been incorporated by reference, teaches a generalized method for conducting electroless deposition of cobalt using three distinct process phases in a thin-liquid-layer reactor. The teachings of U.S. application Ser. No. 10/609,518 are adaptable to methods and apparati in accordance with the present invention. As described above, a system 800 as depicted in FIG. 8 is useful for conducting a plurality of treatments sequentially in a reaction vessel. A systems such as system 800 is also suitable for combining a plurality of treatment chemistries at the point of use in a reaction vessel. This is useful when combined chemistries are very reactive and must remain separate until actual use.

Figure 9:
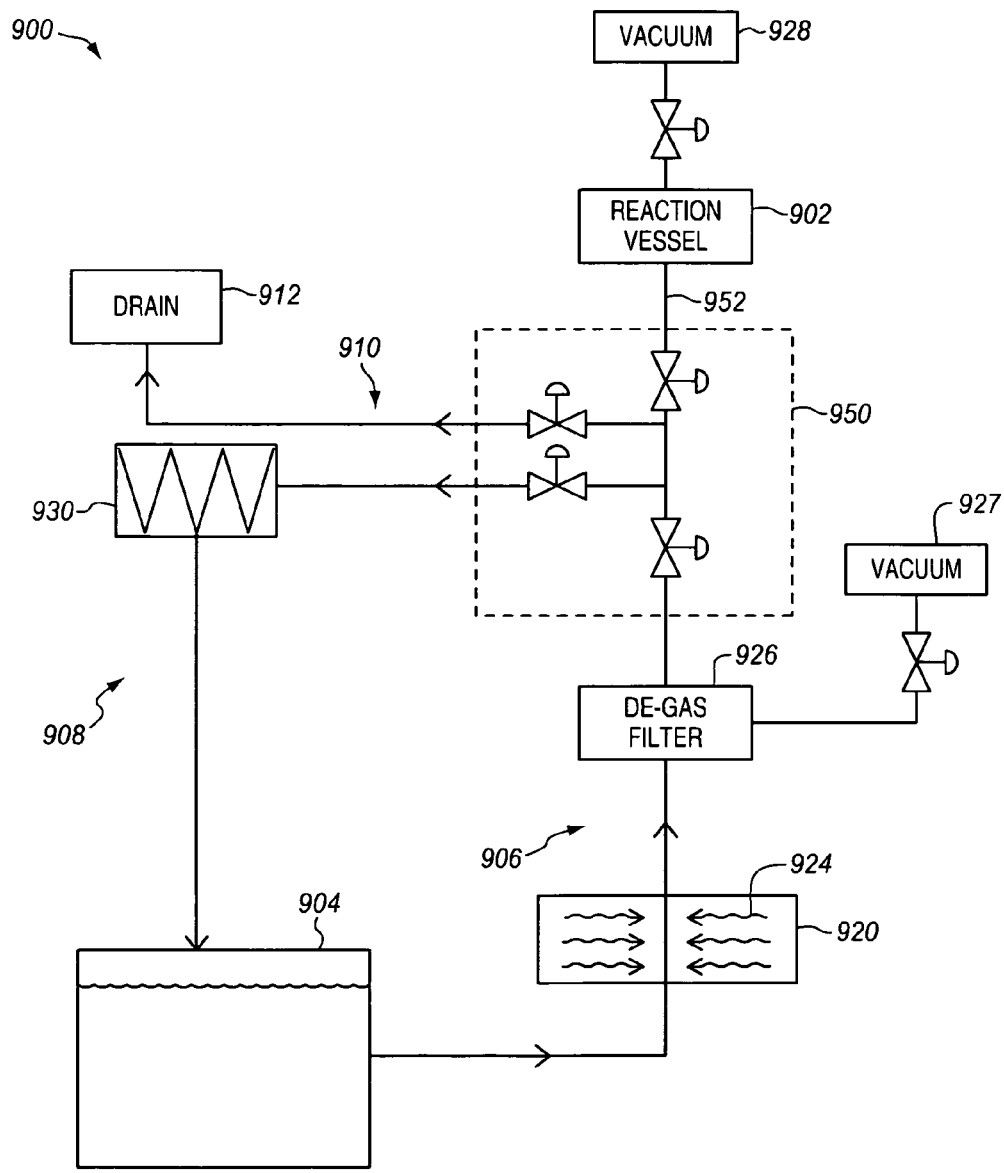
FIG. 9 depicts schematically a simplified process flow diagram of a system in accordance with the invention having a reaction vessel and a main reservoir.

FIG. 9 depicts schematically a simplified process flow diagram of a system 900 in accordance with the invention having a reaction vessel 902 and a main reservoir 904. System 900 further includes a feed conduit 906 for flowing cooled liquid from main reservoir 904 towards reaction vessel 902, and a recycle conduit 908 for flowing reactant liquid from reaction vessel 902 to main reservoir 904. System 900 further includes a drain conduit 910 for flowing reactant liquid or other liquid (for example, rinsing liquid) from reaction vessel 902 to a drain system 912. System 900 further includes an in-line heater 920 for heating reactant liquid in tubing 922 of feed conduit 906 so that the reactant liquid is pre-heated before it enters reaction vessel 902. In preferred embodiments of system 900, heater 920 is a microwave heater, which heats reactant liquid in feed conduit 906 using microwave energy (indicated by arrows 924). System 900 further includes a de-gassing system 926 connected to vacuum 927. De-gassing systems are commercially available and typically comprise a microfilter or series of microfilters. De-gassing system 926 is useful for removing gas bubbles that tend to form in reactant liquid as a result of heating in feed conduit 906. Application of a partial vacuum in de-gassing system 926 serves to draw gas out of solution and also removes gas bubbles from the liquid. Optional vacuum system 928 serves to pull reactant liquid into reaction vessel 902 as well as remove undesired gases out of reaction vessel 902. Alternatively or additionally, pumps (not shown) are used to move liquid through feed conduit 906, recycle conduit 908 and drain conduit 910. System 900 further includes a recycle cooler 930, which cools reactant liquid in recycle conduit 908 before the liquid returns to main reservoir 904. System 900 further includes a manifold 950, which connects a fluid port 952 of reaction vessel 902 to feed conduit 906, recycle conduit 908 and drain conduit 940.

Figure 10:
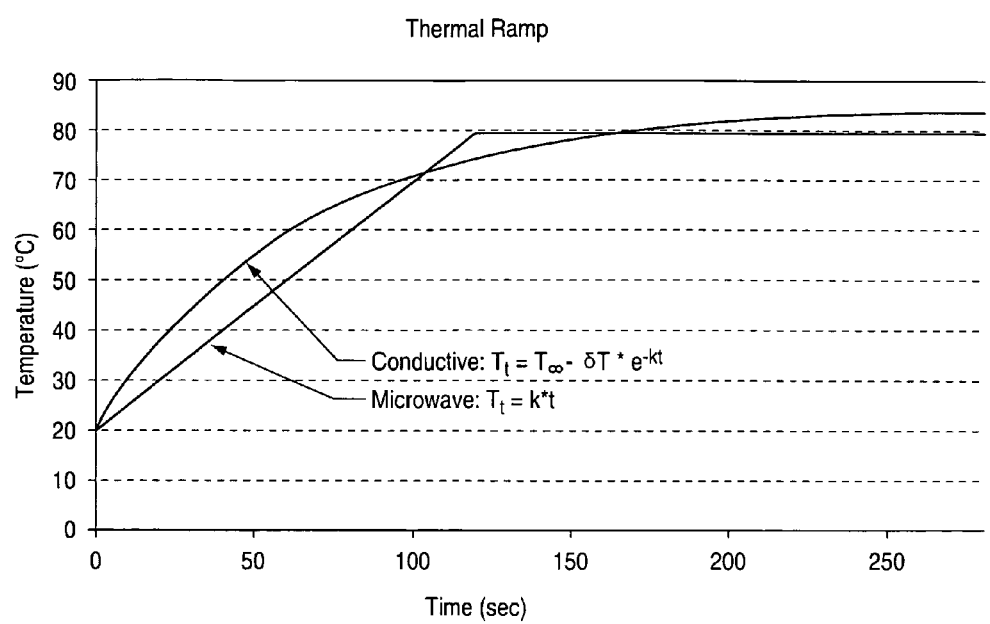
FIG. 10 shows the thermal profile of a fluid volume subject to a conventional conductive heating element as compared to a similar volume heated by microwave energy.

FIG. 10 contains a graph showing the prophetic thermal profile of a fluid volume subject to a conventional conductive heating element as compared to a similar volume heated by microwave energy. As shown in FIG. 10, conductive heating requires that the heating element be operated at a temperature above the desired bulk-fluid temperature. The higher the thermal gradient, the faster the fluid attains the desired temperature. In FIG. 10, the desired bulk-fluid temperature of 80° C. is attained at time equals 171 seconds, with a d_Temp/d_time slope of 0.8° C./sec. If the fluid is retained in the heating vessel for an extra 13 seconds, the bulk-fluid rises over-temperature by 1° C.

For the sake of clarity and simplicity in describing embodiments in this specification, many elements inherent in systems were not expressly described. For example, it is understood that systems 600, 700, and 800 generally include drain conduits, which were not depicted in FIGS. 6, 7 and 8. As another example, embodiments depicted in FIGS. 2, 4, 6-9 include pumps for moving liquid through the system, some of which were not shown or described.

Systems and methods in accordance with the invention allow flexibility in the design and operation of liquid management and liquid reaction treatments to achieve, among others, the following desirable effects: a relatively fast delivery rate of reactant liquid to a reaction vessel; a heating rate of reactant liquid from cool reservoir temperature to reaction temperature, uncoupled from the delivery rate; avoidance of localized overheating of liquid above a desired set-point temperature; avoidance of undesired absorption of gases into the reaction liquid; degassing of reactant liquid before its delivery to a reaction vessel; minimal exposure of reactant liquid to oxidizing gases; relatively fast emptying rate of reactant liquid from a reaction vessel uncoupled from the cooling rate of recycled reactant liquid; minimization of total time at elevated temperature of reactant liquid (thermal budget). As a result, consumption of reactant liquid is minimized, control of reaction conditions is improved compared to the prior art, and manufacturing throughput and yield are improved.

The particular systems, designs, methods and compositions described herein are intended to illustrate the functionality and versatility of the invention, but should not be construed to be limited to those particular embodiments. Systems and methods in accordance with the invention are useful in a wide variety of circumstances and applications to manage reactant liquid used for liquid chemical-reaction treatment and other liquid-phase treatments performed on an integrated circuit substrate. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. For example, in some embodiments, a recycle accumulator vessel is located in a recycle conduit relative to a recycle cooler differently than depicted in FIGS. 4, 6 and 7 without affecting its overall function. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods and compositions described in the claims below and by their equivalents.

The invention claimed is:

1. A method of conducting electroless deposition on an integrated circuit substrate, comprising processes of:
  flowing an electroless reactant liquid from a main reservoir through a feed conduit towards an electroless reaction vessel, wherein said flowing comprises flowing said electroless reactant liquid through an accumulation vessel integral in said feed conduit,
  wherein the temperature of the electroless reactant liquid in the electroless reaction vessel is higher than the temperature of the electroless reactant liquid in the main reservoir and wherein the electroless reactant liquid is heated in a portion of said feed conduit;
  purging a gaseous space above the electroless reactant liquid in said accumulation vessel with a purging gas;
  contacting the integrated circuit substrate with the heated electroless reactant liquid in said electroless reaction vessel to deposit a layer of material;
  flowing a recycle portion of the electroless reactant liquid from said electroless reaction vessel through a recycle conduit towards said main reservoir, wherein the recycle portion is cooled in said recycle conduit prior to entering the main reservoir, wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop.

2. A method of conducting electroless deposition as in claim 1, wherein the electroless reactant liquid is heated in said accumulation vessel.

3. A method of conducting electroless deposition as in claim 1, further comprising:
creating a partial vacuum in said accumulation vessel.

4. A method of conducting electroless deposition as in claim 1, further comprising:
stilling the electroless reactant liquid in a stilling chamber located in said accumulation vessel.

5. A method of conducting electroless deposition as in claim 1, wherein heating said electroless reactant liquid comprises:
heating a bulk of said electroless reactant liquid in the feed conduit by a microwave heater.

6. A method of conducting electroless deposition as in claim 1, wherein flowing the recycle portion of said electroless reactant liquid through a recycle conduit comprises:
flowing said electroless reactant liquid through a recycle accumulator vessel in said recycle conduit.

7. A method of conducting electroless deposition as in claim 6, further comprising:
creating a partial vacuum in said recycle accumulator vessel.

8. A method of conducting electroless deposition as in claim 6, wherein cooling said recycle portion in said recycle conduit comprises:
flowing said electroless reactant liquid through a cooling loop in said recycle conduit.

9. The method of claim 6, wherein the recycle accumulation vessel in the recycle conduit is configured to decouple the rate of electroless reactant liquid cooling from the rate of emptying of the electroless reaction vessel.

10. The method of claim 9, wherein the recycle accumulation vessel comprises a recycle cooling loop configured to recirculate the recycled electroless reactant liquid in the recycle conduit before said liquid enters the main reservoir.

11. The method of claim 10, wherein the volume of the recycle cooling loop is greater than the volume of the electroless reaction vessel.

12. The method of claim 9, wherein the recycle accumulation vessel comprises at least one temperature sensor configured for determining whether the recycled electroless reactant liquid has been cooled below a desired temperature for a return to the main reservoir.

13. A method of conducting electroless deposition as in claim 1, further comprising:
creating a partial vacuum in said main reservoir.

14. A method of conducting electroless deposition as in claim 1, further comprising:
purging a gaseous space above cooled electroless reactant liquid in said main reservoir with a purging gas.

15. The method of claim 1, wherein the main reservoir further comprises a cooling mechanism configured to maintain the electroless reactant liquid in the main reservoir below desired temperature.

16. The method of claim 15, wherein the cooling mechanism is configured to maintain the electroless reactant liquid in the main reservoir at a temperature of between about 5-25° C.

17. The method of claim 1, comprising flowing the reactant fluid to a plurality of electroless reaction vessels.

18. The method of claim 1, further comprising draining a portion of the electroless reactant liquid from the electroless reaction vessel.

19. The method of claim 1, wherein the electroless reactant liquid is recycled using a bleed and feed process.

20. The method of claim 1, wherein the electroless reactant liquid is recycled using a batch process.

21. The method of claim 1, wherein the electroless reactant liquid is actively cooled in the recycle conduit.

22. The method of claim 1, wherein the electroless reactant liquid can partially decompose at the temperature at which the electroless deposition is conducted in the electroless reaction vessel.

23. The method of claim 22, wherein the electroless reactant liquid releases hydrogen gas during decomposition.

24. The method of claim 22, wherein the electroless reactant liquid forms metal particles in the bulk of the liquid during decomposition.

25. The method of claim 1, wherein the electroless reactant liquid is heated to a temperature of between about 40-90° C. to conduct electroless deposition.

26. The method of claim 1, further comprising filtering the electroless reactant liquid in the feed conduit to remove particulate material.

27. The method of claim 1, further comprising removing gas from the heated electroless reactant liquid by degassing with filters in the feed conduit.

28. The method of claim 1, wherein the electroless deposition comprises electroless deposition of cobalt or nickel.

29. The method of claim 1, wherein the electroless deposition comprises electroless deposition of copper.

30. The method of claim 1, wherein the main reservoir, the feed conduit and the recycle conduit are substantially closed to the atmosphere.

31. The method of claim 1, wherein the main reservoir, the feed conduit and the recycle conduit are purged with an inert gas or are evacuated to prevent contact with air.

32. The method of claim 1, wherein the accumulation vessel in the feed conduit is configured to decouple the rate of electroless reactant liquid heating from the rate of electroless reactant liquid delivery to the electroless reaction vessel.

33. The method of claim 32, wherein the volume of the accumulation vessel is in a range of about one to three times the volume of the electroless reaction vessel.

34. The method of claim 1, wherein at least a portion of the accumulation vessel is transparent to microwave energy, and wherein the electroless reactant liquid is heated in the accumulation vessel with a microwave heater.

35. The method of claim 34, wherein the accumulation vessel comprises at least one temperature sensor configured to monitor the temperature of the heated electroless reactant liquid.

36. The method of claim 1, wherein the electroless reaction vessel is a microcell apparatus.

37. A method of conducting liquid reaction treatment of an integrated circuit substrate with a thermally unstable reactant liquid subject to partial decomposition at the treatment temperature, comprising processes of:
flowing the reactant liquid from a main reservoir through a feed conduit towards a reaction vessel, wherein the temperature of the reactant liquid in the reaction vessel is higher than the temperature of the electroless reactant liquid in the main reservoir and wherein the reactant liquid is heated in a portion of said feed conduit prior to entering the reaction vessel;
contacting the integrated circuit substrate with the heated reactant liquid in said reaction vessel to perform the desired liquid reaction treatment, at a temperature which may cause partial decomposition of the reactant liquid;

flowing a recycle portion of the reactant liquid from the reaction vessel through a recycle conduit towards said main reservoir, wherein the recycle portion is cooled in said recycle conduit to a temperature at which the recycled reactant liquid is substantially stable, prior to entering the main reservoir, wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop, wherein the main reservoir, the feed conduit and the recycle conduit are substantially closed to the atmosphere.

38. The method of claim 37, wherein the main reservoir further comprises a cooling mechanism configured to maintain the reactant liquid in the main reservoir below desired temperature.

39. The method of claim 37, wherein a recycle accumulation vessel in the recycle conduit is configured to decouple the rate of reactant liquid cooling from the rate of emptying of the reaction vessel.

40. The method of claim 39, wherein the recycle accumulation vessel comprises a recycle cooling loop configured to recirculate the recycled reactant liquid in the recycle conduit before said liquid enters the main reservoir.

41. The method of claim 40, wherein the volume of the recycle cooling loop is greater than the volume of the reaction vessel.

42. The method of claim 37, wherein the recycle conduit comprises at least one temperature sensor configured for determining whether the recycled reactant liquid has been cooled below a desired temperature for a return to the main reservoir.

43. The method of claim 37, wherein the feed conduit comprises an accumulation vessel configured for heating the reactant liquid to a desired temperature.

44. The method of claim 43, comprising heating the reactant liquid in the accumulation vessel by microwave heating.

45. The method of claim 43, wherein the accumulation vessel in the feed conduit is configured to decouple the rate of the reactant liquid heating from the rate of the reactant liquid delivery to the reaction vessel.

46. The method of claim 43, wherein the accumulation vessel comprises at least one temperature sensor configured to monitor the temperature of the heated reactant liquid.

47. A method of conducting electroless deposition on an integrated circuit substrate, comprising processes of:
flowing an electroless reactant liquid from a main reservoir through a feed conduit towards an electroless reaction vessel, wherein said flowing comprises flowing said electroless reactant liquid through an accumulation vessel integral in said feed conduit,
wherein the temperature of the electroless reactant liquid in the electroless reaction vessel is higher than the temperature of the electroless reactant liquid in the main reservoir and wherein the electroless reactant liquid is heated in a portion of said feed conduit;
creating a partial vacuum in said accumulation vessel;
contacting the integrated circuit substrate with the heated electroless reactant liquid in said electroless reaction vessel to deposit a layer of material;
flowing a recycle portion of the electroless reactant liquid from said electroless reaction vessel through a recycle conduit towards said main reservoir, wherein the recycle portion is cooled in said recycle conduit prior to entering the main reservoir, wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop.

48. The method of claim 47, the method comprising heating the electroless reactant liquid by microwave heating.

49. The method of claim 47, wherein the main reservoir, the feed conduit and the recycle conduit are purged with an inert gas or are evacuated to prevent contact with air.

50. The method of claim 47, wherein the electrolessly platable metal is selected from the group consisting of cobalt, nickel, and copper.

51. A method of conducting electroless deposition on an integrated circuit substrate, comprising processes of:
flowing an electroless reactant liquid from a main reservoir through a feed conduit towards an electroless reaction vessel, wherein the temperature of the electroless reactant liquid in the electroless reaction vessel is higher than the temperature of the electroless reactant liquid in the main reservoir and wherein the electroless reactant liquid is heated in a portion of said feed conduit;
creating a partial vacuum in said main reservoir;
contacting the integrated circuit substrate with the heated electroless reactant liquid in said electroless reaction vessel to deposit a layer of material;
flowing a recycle portion of the electroless reactant liquid from said electroless reaction vessel through a recycle conduit towards said main reservoir, wherein the recycle portion is cooled in said recycle conduit prior to entering the main reservoir, wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop.

52. The method of claim 51, the method comprising heating the electroless reactant liquid by microwave heating.

53. The method of claim 51, wherein the main reservoir, the feed conduit and the recycle conduit are purged with an inert gas or are evacuated to prevent contact with air.

54. The method of claim 51, wherein the electrolessly platable metal is selected from the group consisting of cobalt, nickel, and copper.

55. A method of conducting electroless deposition on an integrated circuit substrate, comprising processes of:
flowing an electroless reactant liquid from a main reservoir through a feed conduit towards an electroless reaction vessel, wherein the temperature of the electroless reactant liquid in the electroless reaction vessel is higher than the temperature of the electroless reactant liquid in the main reservoir and wherein the electroless reactant liquid is heated in a portion of said feed conduit;
contacting the integrated circuit substrate with the heated electroless reactant liquid in said electroless reaction vessel to deposit a layer of material;
flowing a recycle portion of the electroless reactant liquid from said electroless reaction vessel through a recycle conduit towards said main reservoir, wherein the recycle portion is cooled in said recycle conduit prior to entering the main reservoir, wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop; and purging a gaseous space above cooled electroless reactant liquid in said main reservoir with a purging gas.

56. The method of claim 55, the method comprising heating the electroless reactant liquid by microwave heating.

57. The method of claim 55, wherein the main reservoir, the feed conduit and the recycle conduit are purged with an inert gas or are evacuated to prevent contact with air.

58. The method of claim 55, wherein the electrolessly platable metal is selected from the group consisting of cobalt, nickel, and copper.

59. A method of conducting electroless deposition on an integrated circuit substrate, comprising processes of:
flowing an electroless reactant liquid from a main reservoir through a feed conduit towards an electroless reaction vessel, wherein the temperature of the electroless reactant liquid in the electroless reaction vessel is higher than the temperature of the electroless reactant liquid in the main reservoir and wherein the electroless reactant liquid is heated in a portion of said feed conduit;
contacting the integrated circuit substrate with the heated electroless reactant liquid in said electroless reaction vessel to deposit a layer of material;
flowing a recycle portion of the electroless reactant liquid from said electroless reaction vessel through a recycle conduit towards said main reservoir, wherein the recycle portion is cooled in said recycle conduit prior to entering the main reservoir, wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop; wherein
the main reservoir, the feed conduit and the recycle conduit are substantially closed to the atmosphere.

60. The method of claim 59, the method comprising heating the electroless reactant liquid by microwave heating.

61. The method of claim 59, wherein the main reservoir, the feed conduit and the recycle conduit are purged with an inert gas or are evacuated to prevent contact with air.

62. The method of claim 59, wherein the electrolessly platable metal is selected from the group consisting of cobalt, nickel, and copper.

63. A method of conducting electroless deposition on an integrated circuit substrate, comprising processes of:
flowing an electroless reactant liquid from a main reservoir through a feed conduit towards an electroless reaction vessel, wherein the temperature of the electroless reactant liquid in the electroless reaction vessel is higher than the temperature of the electroless reactant liquid in the main reservoir and wherein the electroless reactant liquid is heated in a portion of said feed conduit;
contacting the integrated circuit substrate with the heated electroless reactant liquid in said electroless reaction vessel to deposit a layer of material;
flowing a recycle portion of the electroless reactant liquid from said electroless reaction vessel through a recycle conduit towards said main reservoir, wherein the recycle portion is cooled in said recycle conduit prior to entering the main reservoir, wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop; wherein the main reservoir, the feed conduit and the recycle conduit are purged with an inert gas or are evacuated to prevent contact with air.

64. The method of claim 63, the method comprising heating the electroless reactant liquid by microwave heating.

65. The method of claim 63, wherein the electrolessly platable metal is selected from the group consisting of cobalt, nickel, and copper.

66. A method of conducting electroless deposition on an integrated circuit substrate, comprising processes of:
flowing an electroless reactant liquid from a main reservoir through a feed conduit towards an electroless reaction vessel, wherein the temperature of the electroless reactant liquid in the electroless reaction vessel is higher than the temperature of the electroless reactant liquid in the main reservoir and wherein the electroless reactant liquid is heated in a portion of said feed conduit;
contacting the integrated circuit substrate with the heated electroless reactant liquid in said electroless reaction vessel to deposit a layer of material;
flowing a recycle portion of the electroless reactant liquid from said electroless reaction vessel through a recycle conduit towards said main reservoir, wherein the recycle portion is cooled in said recycle conduit prior to entering the main reservoir, wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop; wherein flowing the recycle portion of said electroless reactant liquid through a recycle conduit comprises flowing said electroless reactant liquid through a recycle accumulator vessel in said recycle conduit, said recycle accumulation vessel in the recycle conduit being configured to decouple the rate of electroless reactant liquid cooling from the rate of emptying of the electroless reaction vessel, wherein the recycle accumulation vessel comprises a recycle cooling loop configured to recirculate the recycled electroless reactant liquid in the recycle conduit before said liquid enters the main reservoir.

67. The method of claim 66, the method comprising heating the electroless reactant liquid by microwave heating.

68. The method of claim 66, wherein the main reservoir, the feed conduit and the recycle conduit are purged with an inert gas or are evacuated to prevent contact with air.

69. The method of claim 66, wherein the electrolessly platable metal is selected from the group consisting of cobalt, nickel, and copper.

70. A method of conducting electroless deposition on an integrated circuit substrate, comprising processes of:
flowing an electroless reactant liquid from a main reservoir through a feed conduit towards an electroless reaction vessel, wherein the temperature of the electroless reactant liquid in the electroless reaction vessel is higher than the temperature of the electroless reactant liquid in the main reservoir and wherein the electroless reactant liquid is heated in a portion of said feed conduit;
contacting the integrated circuit substrate with the heated electroless reactant liquid in said electroless reaction vessel to deposit a layer of material;
flowing a recycle portion of the electroless reactant liquid from said electroless reaction vessel through a recycle conduit towards said main reservoir, wherein the recycle portion is cooled in said recycle conduit prior to entering the main reservoir, wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop; wherein the electroless reaction vessel is a microcell apparatus.

71. The method of claim 70, the method comprising heating the electroless reactant liquid by microwave heating.

72. The method of claim 70, wherein the main reservoir, the feed conduit and the recycle conduit are purged with an inert gas or are evacuated to prevent contact with air.

73. The method of claim 70, wherein the electrolessly platable metal is selected from the group consisting of cobalt, nickel, and copper.

74. A method of conducting liquid reaction treatment of an integrated circuit substrate with a thermally unstable reactant liquid subject to partial decomposition at the treatment temperature, comprising processes of:
   flowing the reactant liquid from a main reservoir through a feed conduit towards a reaction vessel, wherein the temperature of the reactant liquid in the reaction vessel is higher than the temperature of the electroless reactant liquid in the main reservoir and wherein the reactant liquid is heated in a portion of said feed conduit prior to entering the reaction vessel;
   contacting the integrated circuit substrate with the heated reactant liquid in said reaction vessel to perform the desired liquid reaction treatment, at a temperature which may cause partial decomposition of the reactant liquid;
   flowing a recycle portion of the reactant liquid from the reaction vessel through a recycle conduit towards said main reservoir, wherein the recycle portion is cooled in said recycle conduit to a temperature at which the recycled reactant liquid is substantially stable, prior to entering the main reservoir, wherein a recycle accumulation vessel in the recycle conduit is configured to decouple the rate of reactant liquid cooling from the rate of emptying of the reaction vessel wherein the recycle accumulation vessel comprises a recycle cooling loop configured to recirculate the recycled reactant liquid in the recycle conduit before said liquid enters the main reservoir;
   wherein the main reservoir, the feed conduit, the electroless reaction vessel and the recycle conduit are components of an electroless reactant liquid recirculation loop, and wherein the electroless reactant liquid comprises ions of electrolessly platable metal in the entirety of the recirculation loop.

75. The method of claim 74, the method comprising heating the electroless reactant liquid by microwave heating.

76. The method of claim 74, wherein the main reservoir, the feed conduit and the recycle conduit are purged with an inert gas or are evacuated to prevent contact with air.

77. The method of claim 74, wherein the electrolessly platable metal is selected from the group consisting of cobalt, nickel, and copper.

* * * * *

UNITED STATES PATENT AND TRADEMARK OFFICE
CERTIFICATE OF CORRECTION

PATENT NO. : 8,257,781 B1  
APPLICATION NO. : 11/201709  
DATED : September 4, 2012  
INVENTOR(S) : Webb et al.

Page 1 of 1

It is certified that error appears in the above-identified patent and that said Letters Patent is hereby corrected as shown below:

On the title page item [75], David Mark Dinneen should read Daniel Mark Dinneen

Signed and Sealed this
Fourth Day of June, 2013

Teresa Stanek Rea
*Acting Director of the United States Patent and Trademark Office*